US012588348B2

(12) United States Patent (10) Patent No.: US 12,588,348 B2
Vasen et al. (45) Date of Patent: Mar. 24, 2026

(54) METHOD OF MANUFACTURING A EFFECT TRANSISTOR USING CARBON NANOTUBES AND A FIELD EFFECT TRANSISTOR

(71) Applicant: Taiwan Semiconductor Manufacturing Company, Ltd., Hsinchu (TW)

(72) Inventors: Timothy Vasen, Linthicum Heights, MD (US); Mark Van Dal, Linden (BE); Gerben Doornbos, Kessel-Lo (BE); Matthias Passlack, Hayward, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/649,075

(22) Filed: Apr. 29, 2024

(65) Prior Publication Data

US 2024/0284688 A1 Aug. 22, 2024

Related U.S. Application Data

(60) Continuation of application No. 17/874,284, filed on Jul. 27, 2022, now Pat. No. 12,010,856, which is a
(Continued)

(51) Int. Cl.
H10K 10/46 (2023.01)
H10K 19/10 (2023.01)
H10K 85/20 (2023.01)

(52) U.S. Cl.
CPC ......... H10K 10/484 (2023.02); H10K 10/464 (2023.02); H10K 10/472 (2023.02);
(Continued)

(58) Field of Classification Search
CPC .... H10K 10/48; H10K 10/464; H10K 10/472; H10K 10/481; H10K 19/10;
(Continued)

(56) References Cited

U.S. PATENT DOCUMENTS 9,472,773 B1 * 10/2016 Rosenblatt ........ H01L 29/42392
10,930,766 B2 2/2021 Rachmady et al.
(Continued)

FOREIGN PATENT DOCUMENTS

CN 107690704 A 2/2018
DE 102018108821 A1 4/2019
(Continued)

OTHER PUBLICATIONS

Max M. Shulaker et al., "High-Performance Carbon Nanotube Field-Effect Transistors", Electron Devices Meeting (IEDM), 2014 IEEE International, pp. 33.6.1 to 33.6.4 (Dec. 15, 2014).
(Continued)

*Primary Examiner* — Julia Slutsker
(74) *Attorney, Agent, or Firm* — STUDEBAKER BRACKETT PLLC

(57) ABSTRACT

In a method of forming a gate-all-around field effect transistor (GAA FET), a bottom support layer is formed over a substrate and a first group of carbon nanotubes (CNTs) are disposed over the bottom support layer. A first support layer is formed over the first group of CNTs and the bottom support layer such that the first group of CNTs are embedded in the first support layer. A second group of carbon nanotubes (CNTs) are disposed over the first support layer. A second support layer is formed over the second group of CNTs and the first support layer such that the second group of CNTs are embedded in the second support layer. A fin structure is formed by patterning at least the first support layer and the second support layer.

20 Claims, 18 Drawing Sheets

Related U.S. Application Data continuation of application No. 16/940,321, filed on Jul. 27, 2020, now Pat. No. 11,437,594, which is a division of application No. 16/120,158, filed on Aug. 31, 2018, now Pat. No. 10,727,427.

(52) U.S. Cl.
CPC ........... *H10K 10/481* (2023.02); *H10K 19/10* (2023.02); *H10K 85/221* (2023.02)

(58) Field of Classification Search
CPC .. H10K 85/221; H10K 10/482; H10K 10/484; H10K 71/20; H10K 10/82; H01L 29/42392; H01L 21/02606; H01L 27/0617; H01L 21/027; H01L 21/31051; H01L 21/31105; H10D 84/40; H10D 30/6735
See application file for complete search history.

(56) References Cited

U.S. PATENT DOCUMENTS

| | | | |
|---|---|---|---|
| 2011/0171419 A1* | 7/2011 | Li | H10K 85/221 |
| | | | 428/221 |
| 2012/0012803 A1 | 1/2012 | Oshino | |
| 2012/0032149 A1 | 2/2012 | Chen et al. | |
| 2012/0261643 A1 | 10/2012 | Cohen et al. | |
| 2013/0126830 A1 | 5/2013 | Cao et al. | |
| 2014/0138623 A1 | 5/2014 | Franklin et al. | |
| 2014/0138625 A1 | 5/2014 | Franklin et al. | |
| 2014/0151814 A1 | 6/2014 | Giles et al. | |
| 2015/0228480 A1 | 8/2015 | Mn et al. | |
| 2015/0303197 A1 | 10/2015 | Ching et al. | |
| 2016/0293668 A1 | 10/2016 | Cao et al. | |
| 2017/0170267 A1 | 6/2017 | Rosenblatt et al. | |
| 2018/0130886 A1 | 5/2018 | Kim et al. | |
| 2018/0138289 A1 | 5/2018 | Rachmady et al. | |
| 2018/0226490 A1 | 8/2018 | Le et al. | |
| 2018/0254329 A1 | 9/2018 | Guillorn et al. | |
| 2019/0103317 A1 | 4/2019 | Yu et al. | |
| 2019/0165135 A1 | 5/2019 | Cheng et al. | |
| 2019/0214460 A1 | 7/2019 | Mistkawi et al. | |

FOREIGN PATENT DOCUMENTS

| | | |
|---|---|---|
| JP | 2004259667 A | 9/2004 |
| KR | 10-2014-0091754 A | 7/2014 |
| KR | 10-2016-0101213 A | 8/2016 |
| KR | 10-2018-0021118 A | 2/2018 |
| KR | 10-2018-0051845 A | 5/2018 |
| WO | 2013/095651 A1 | 6/2013 |

OTHER PUBLICATIONS

Aaron D. Franklin et al., "Carbon Nanotube Complementary Wrap-Gate Transistors", Nano Letters, 13, 2490-2495 (2013).
Ale Imran et al., "Optimized Design of a 32-nm CNFET-Based Low-Power Ultrawideband CCII," IEEE Transactions on Nanotechnology, vol. 11, No. 6, pp. 1100-1109 (Nov. 2012).
Non-Final Office Action issued in U.S. Appl. No. 16/120,158, dated Dec. 11, 2019.
Notice of Allowance issued in U.S. Appl. No. 16/120,158, dated Mar. 20, 2020.
Non-Final Office Action issued in U.S. Appl. No. 16/940,321, dated Sep. 29, 2021.
Final Office Action issued in U.S. Appl. No. 16/940,321, dated Feb. 2, 2022.
Notice of Allowance issued in U.S. Appl. No. 16/940,321, dated Apr. 28, 2022.
Non-Final Office Action issued in U.S. Appl. No. 17/874,284, dated Jul. 19, 2023.
Final Office Action issued in U.S. Appl. No. 17/874,284, dated Nov. 7, 2023.
Notice of Allowance issued in U.S. Appl. No. 17/874,284, dated Jan. 31, 2024.

* cited by examiner

METHOD OF MANUFACTURING A EFFECT TRANSISTOR USING CARBON NANOTUBES AND A FIELD EFFECT TRANSISTOR

RELATED APPLICATIONS

This application is a Continuation of U.S. patent application Ser. No. 17/874,284 filed Jul. 27, 2022, now U.S. Pat. No. 12,010,856, which is a Continuation of U.S. patent application Ser. No. 16/940,321 filed Jul. 27, 2020, now U.S. Pat. No. 11,437,594, which is a Divisional of U.S. patent application Ser. No. 16/120,158 filed Aug. 31, 2018, now U.S. Pat. No. 10,727,427, the entire contents of each of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as GAA structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, 2D and 2E illustrate various stages of a sequential fabrication process of a GAA FET in accordance with an embodiment of the present disclosure.

DETAILED DESCRIPTION

Figure 1A:
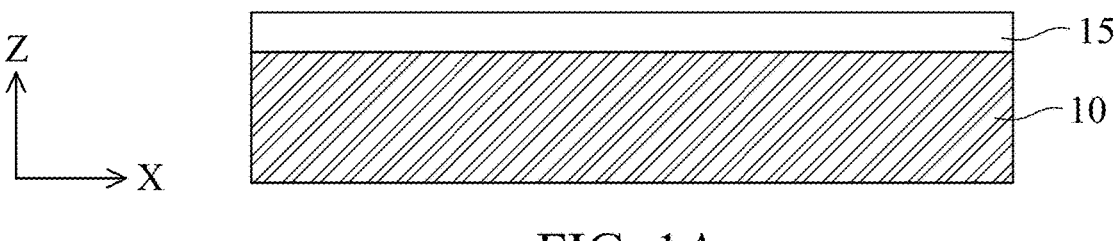
FIGS. 1A, 1B, 1C, 1D, 1E and 1F illustrate various stages of a sequential fabrication process of a GAA FET in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

Carbon nanotubes (CNTs) having diameters in the order of nm (e.g., about 1 nm) are considered a material of choice for making the ultimate scaled FET device due to their cylindrical geometry, excellent electrical and mechanical properties. A field effect transistor (FET) using a CNT with a gate length about 10 nm or less shows excellent electrical characteristics. However, a fabrication technology compatible with a CMOS fabrication technology has not been established. In the present disclosure, by stacking layers of aligned CNTs on a substrate and forming a fin structure from the stacked CNTs, a horizontal gate all around process flow compatible with a CMOS technology is provided.

In some embodiments, semiconductor devices include a novel structure of field-effect transistors including stacked, gate-all-around (GAA) carbon nanotubes (CNTs). The semiconductor devices include an array of aligned CNTs with a gate dielectric layer wrapping therearound and a gate electrode layer. The GAA FETs with CNTs can be applied to logic circuits in advanced technology node. However, fabricating CNT-based devices has led to problems, such as difficulty in increasing CNT density to obtain higher current, preventing inter-tube interactions that degrade CNT performance in a CNT bundle structure, and/or lack of a feasible fabrication process to integrate high-density GAA CNTs into a circuit. The following embodiments provide a GAA FET using CNTs and its manufacturing process that can resolve these problems.

FIGS. 1A-13B illustrate various stages of a sequential fabrication process of a GAA FET using carbon nanotubes in accordance with embodiments of the present disclosure. It is understood that additional operations can be provided before, during, and after processes shown by FIGS. 1A-13B, and some of the operations described below can be replaced or eliminated, for additional embodiments of the method. The order of the operations/processes may be interchangeable.

As shown in FIG. 1A, a bottom support layer 15 is formed over a substrate 10. In some embodiments, the substrate 10 is made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. An insulating material, such as a glass, may be used as the substrate. The bottom support layer 15 is made of an insulating material in some embodiments. In some embodiments, the bottom support layer includes one or more layers of silicon oxide, silicon nitride, SiON, SiOC, SiOCN and SiCN, or other suitable insulating material. In other embodiments, the bottom support layer includes a polycrystalline or amorphous material of one of Si, Ge and SiGe. The bottom support layer 15 can be formed by suitable film formation methods, such as thermal oxidation, chemical vapor deposition (CVD), physical vapor deposition (PVD) or atomic layer deposition (ALD). In certain embodiments, silicon oxide (e.g., $SiO_2$) is used as the bottom support layer 15.

Figure 1B:
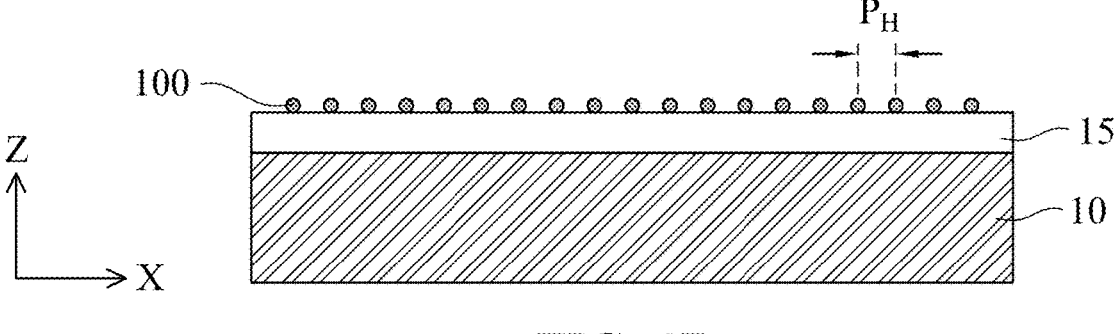

Then, as shown in FIG. 1B, one or more carbon nanotubes (CNTs) 100 are arranged over the bottom support layer 15. In some embodiments, the bottom support layer is not used and the CNTs 100 are directly disposed on the substrate 10. The CNTs are arranged on the bottom support layer 15 aligned with the substantially same direction (e.g., Y direction). The deviation from the Y direction of the alignment of the CNTs 100 is about ±10 degrees in some embodiments, and is about ±5 degrees in other embodiments. In certain embodiments, the deviation is about ±2 degrees. The CNTs 100 are arranged with a density in a range from about 50 tubes/μm to about 300 tubes/μm in some embodiments, and in other embodiments, the density is in a range from about 100 tubes/μm to about 200 tubes/μm. The length of the CNTs 100 (in the Y direction) is in a range from about 0.5 μm to about 5 μm in some embodiments, and is in a range from about 1 μm to about 2 μm in other embodiments. The average diameter of the CNTs 100 is in a range from about 1.0 nm to about 2.0 nm in some embodiments.

Carbon nanotubes can be formed by various methods, such as arc-discharge or laser ablation methods. The formed CNTs are dispersed in a solvent, such as sodium dodecyl sulfate (SDS). The CNTs can be transferred to and disposed on a substrate using various methods, such as a floating evaporative self-assembly method in some embodiments.

Figure 1C:
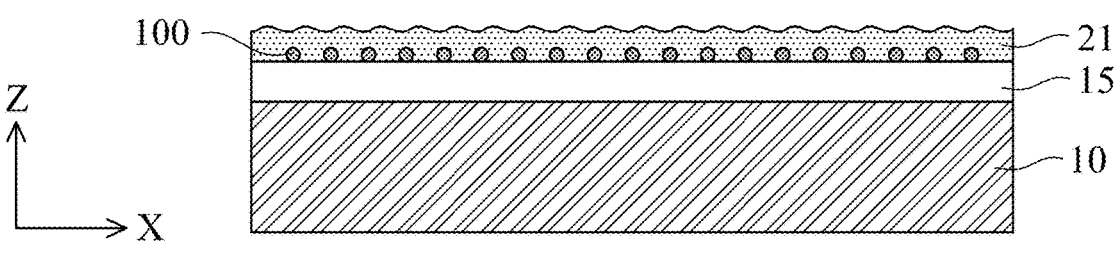

After the CNTs 100 are transferred onto the bottom support layer 15, a first support layer 21 is formed over the CNTs (a first group of CNTs) disposed on the bottom support layer 15, as shown in FIG. 1C. In some embodiments, the first support layer 21 includes a polycrystalline or amorphous material of one of Si, Ge and SiGe. In other embodiments, the first support layer 21 includes one or more layers of silicon oxide, silicon nitride, SiON, SiOC, SiOCN and SiCN, or other suitable insulating material. In some embodiments, the first support layer 21 includes organic material, such as organic polymers. In certain embodiments, the first support layer 21 is made of a different material than the bottom support layer 15. In other embodiments, the first support layer 21 is made of the same material as the bottom support layer 15. The first support layer 21 can be formed by suitable film formation methods, such as CVD, PVD or ALD. In one embodiment, ALD is used for its high thickness uniformity and thickness controllability.

In some embodiments, as shown in FIG. 1C, when the first support layer is conformally formed over the first group of CNTs 100, the upper surface of the first support layer has a wavy shape having peaks and valleys. The thickness of the first support layer 21 is in a range from about 2 nm to about 10 nm in some embodiments, and is in a range from about 3 nm to 5 nm in other embodiments.

Then, a second support layer 22 is formed over the first support layer 21. In some embodiments, the second support layer 22 is made of the same material as the first support layer in some embodiments. The thickness of the second support layer 22 is substantially the same as the thickness of the first support layer 21. The difference in the thickness is within ±5% in some embodiments with respect to the average thickness.

Further, a second group of CNTs 100 are disposed on the second support layer 22. When the upper surface of the first support layer has the wavy shape as shown in FIG. 1C, the second group of CNTs 100 tend to be arranged at the valleys of the wavy shape.

Figure 1D:
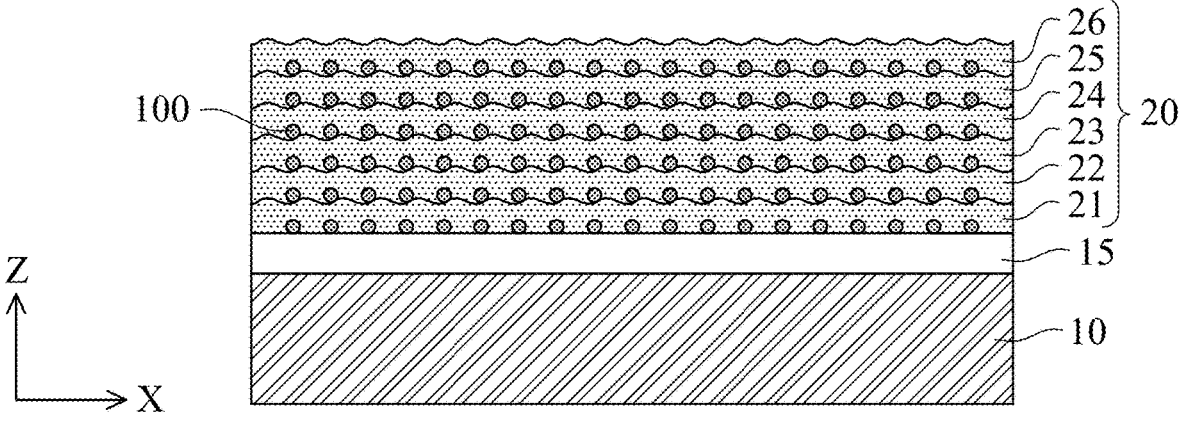

In some embodiments, forming a group of CNTs and forming a support layer are repeated to form n support layers in each of which CNT's are embedded, where n is integer of three or more. In some embodiments, n is up to 20. FIG. 1D shows one embodiment, in which six support layers 21, 22, 23, 24, 25 and 26 are formed, thus forming six layers of CNTs disposed in a support layer 20. In the following explanation, the first to sixth support layers 21-26 are referred to as a support layer 20.

Figure 1E:
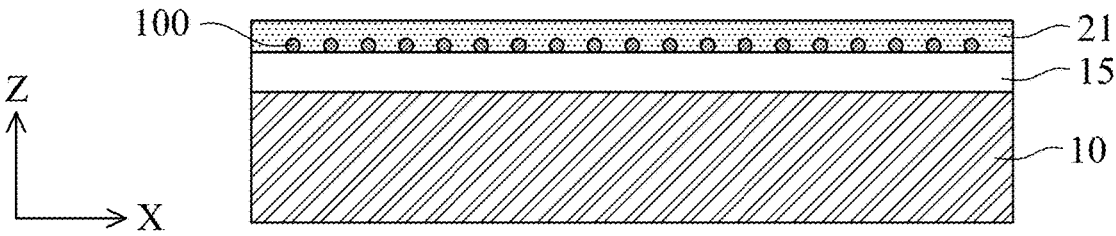

In other embodiments, as shown in FIG. 1E, after the first support layer 21 is formed with the wavy upper surface, one or more planarization operations are performed to flatten the upper surface of the support layer 21. The planarization operation includes an etch-back process or a chemical mechanical polishing (CMP) process. In one embodiment, CMP is used.

Then, as set forth above, the second group of CNTs 100 and the second support layer 22 are formed on the flattened first support layer 21. The process is repeated to obtain the structure shown in FIG. 1F.

Figure 1F:
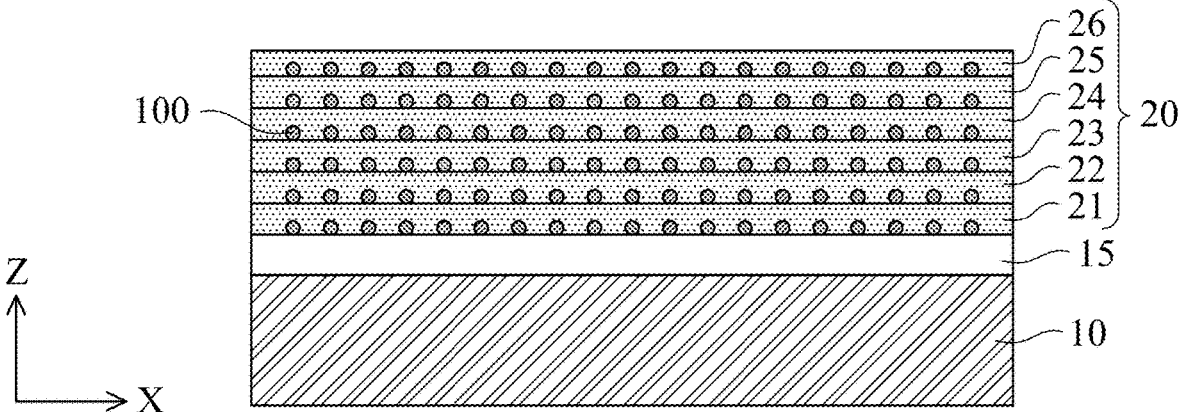

In FIGS. 1D and 1F, the CNT's in one layer are arranged in a constant pitch and the CNT's in the vertical direction are aligned. However, the arrangement of the CNTs in the support layer 20 is not limited to those of FIGS. 1D and 1F. In some embodiments, the CNTs in one layer have random pitch in the X direction. When the average diameter of the CNTs 100 is $D_{CNT}$, horizontal pitch $P_H$ of the CNTs is $D_{CNT} \leq P_H \leq 10 \times D_{CNT}$, in some embodiments. In some embodiments, two adjacent CNTs are in contact with each other. Further, in the vertical direction, at least two CNTs 100 in different layers are not aligned with each other, in some embodiments. The vertical pitch $P_V$ of the CNTs 100 is determined by the thickness of the support layers. In some embodiments, a vertical pitch $P_V$ of the CNTs 100 in adjacent layers is $0.9 \times P_A \leq P_V \leq 1.1 \times P_A$, where $P_A$ is an average pitch of the multiple layers. In other embodiments, the vertical pitch $P_V$ is $0.95 \times P_A \leq P_V \leq 1.05 \times P_A$.

Figures 2A, 2B, 2C, 2D, 2E:
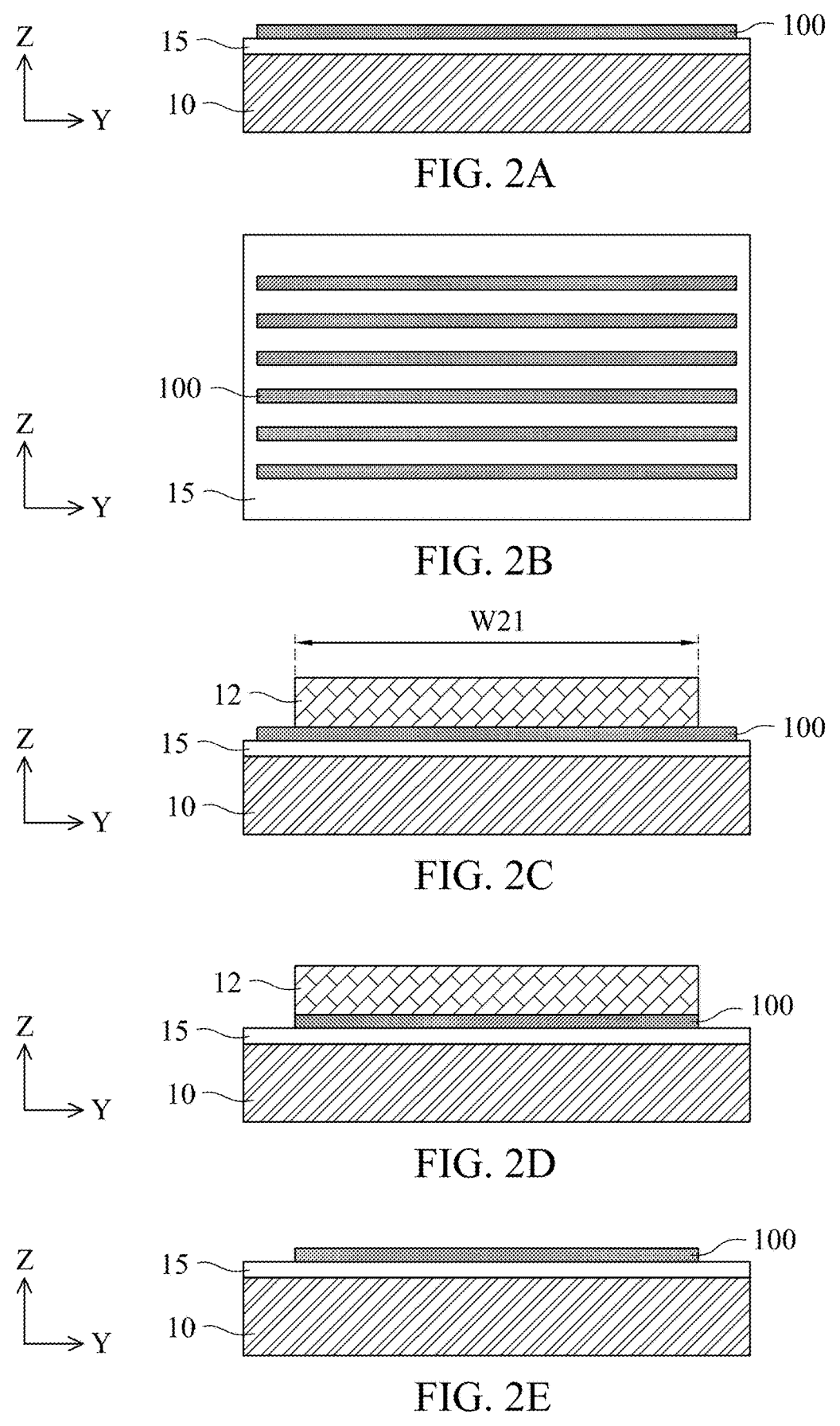

In some embodiments, after the CNTs 100 are transferred over the substrate 10, a trimming process as shown in FIGS. 2A-2E is performed. After the CNTs 100 are transferred onto the bottom support layer 15 as shown in FIGS. 2A and 2B, by using a lithography operation, a photo resist pattern 12, as a cover layer, is formed over a center part of the CNTs 100. End portions of the CNTs 100 are exposed, as shown in FIG. 2C. The width W21 of the photo resist pattern 12 is in a range from about 50 nm to about 2000 nm in some embodiments, and is in a range from about 100 nm to about 1000 nm in other embodiments. Then, the exposed end portions of the CNTs 100 are removed by etching, as shown in FIG. 2D. Further, as shown in FIG. 2E, the resist pattern 12 is then removed by dry etching and/or wet removal using an organic solvent.

Figure 3A:
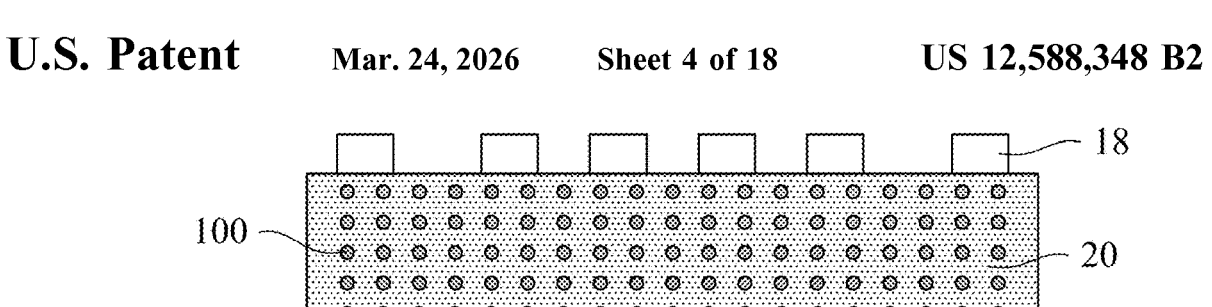
FIGS. 3A, 3B and 3C illustrate various stages of a sequential fabrication process of a GAA FET in accordance with an embodiment of the present disclosure.
Figure 3B:
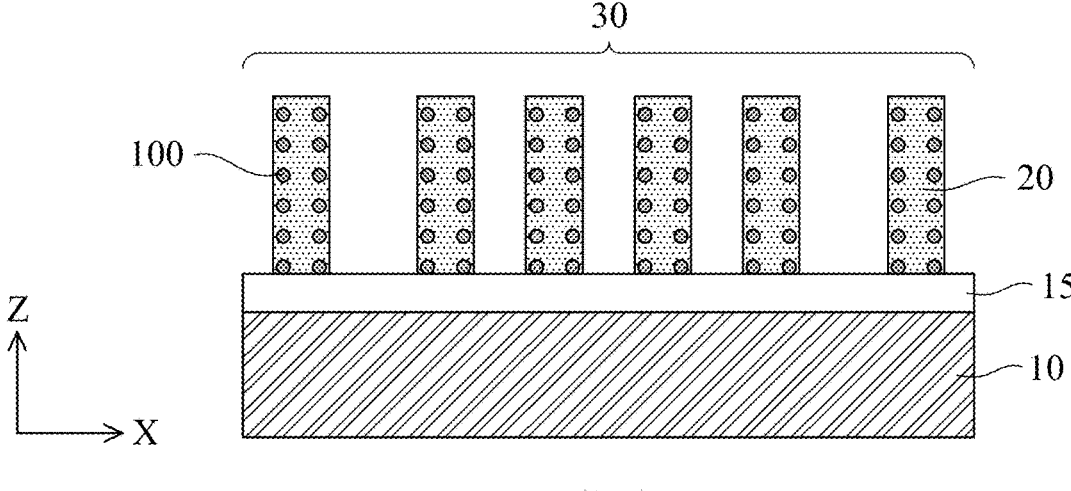

Adverting to FIGS. 3A and 3B, by using one or more lithography and etching operations, a mask pattern 18 is formed over the support layer 20 and the support layer 20 with the CNTs 100 is patterned into one or more fin structures 30. The mask pattern 18 is a photo resist layer in some embodiments, and can be a hard mask made of dielectric material in other embodiments. In some embodiments, the fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

Figure 3C:
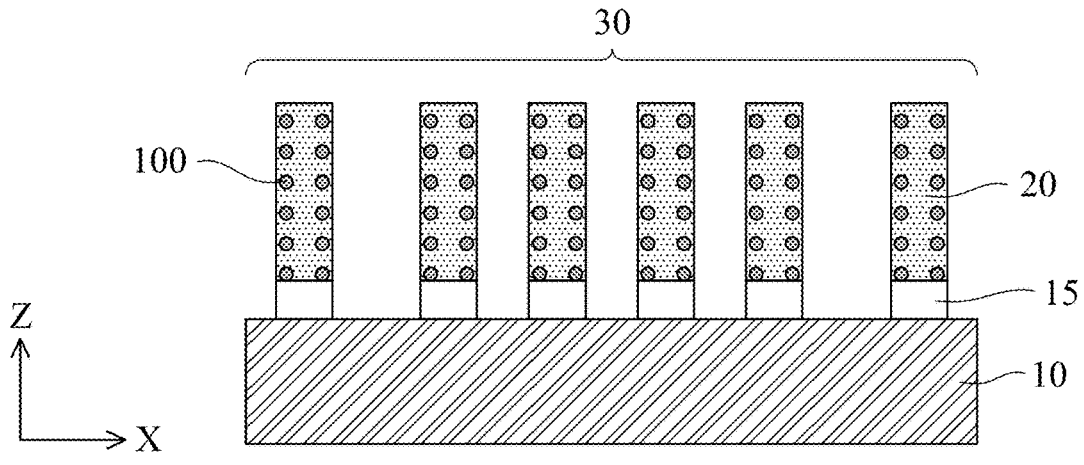

In some embodiments, the width of the fin structures 30 in the X direction is in a range from about 5 nm to about 20 nm, and is in a range from about 7 nm to about 12 nm in other embodiments. In FIG. 3B, the bottom support layer 15 is made of a different material than the support layers 20 and thus the bottom support layer 15 is not patterned. In FIG. 3C, the bottom support layer 15 is made of the same material as or similar material the support layers 20 and thus the bottom support layer 15 is also patterned into fin structure.

The total number of the CNTs 100 per fin structure is in a range from about 5 to about 100 in some embodiments, and is in a range from about 10 about 50 in other embodiments.

Figures 4A, 4B:
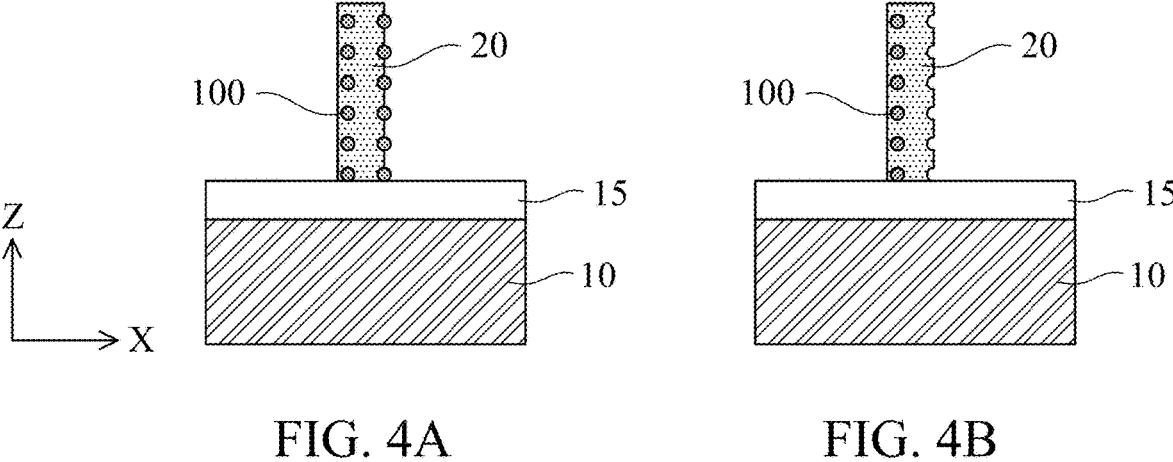
FIGS. 4A, 4B, 4C and 4D illustrate various stages of a sequential fabrication process of a GAA FET in accordance with an embodiment of the present disclosure.

FIGS. 4A-4D show various configurations of CNT's in one fin structure 30. As shown in FIG. 4A, the CNTs 100 are partially exposed at the side surface of the support layer 20 in some embodiments. In such a case, a removal operation is performed to remove the partially exposed CNTs as shown in FIG. 4B. The removal operation can be a plasma treatment using oxygen containing gas.

Figures 4C, 4D:
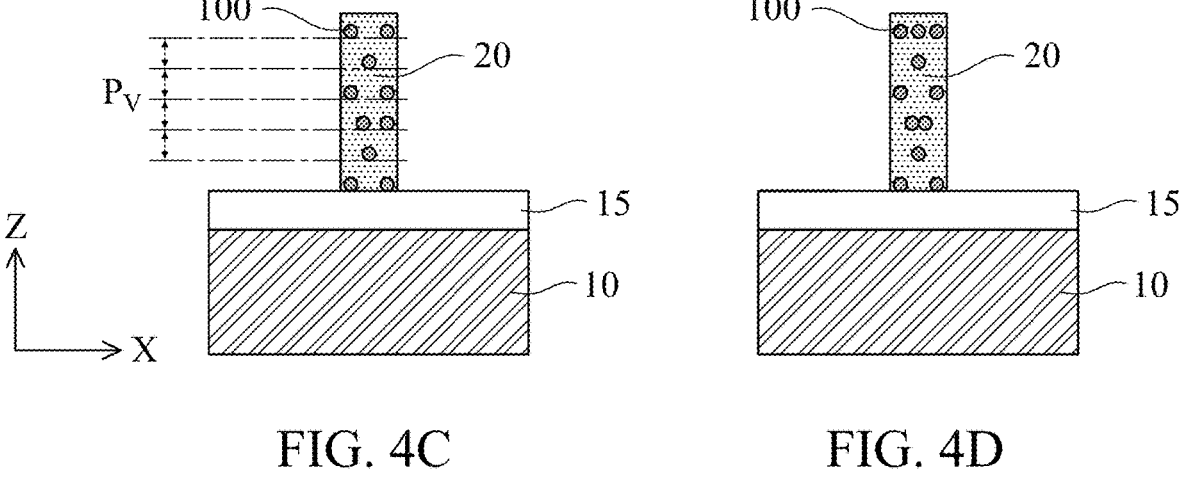

In some embodiments, as shown in FIGS. 4C and 4D, the number of CNTs 100 in one layer is different from another layer. Further, the pitch of the CNTs in one layer is different from the pitch of CNTs 100 in another layer in some embodiments. The pitch of CNTs 100 may vary within one layer in some embodiments. As shown in FIG. 4D, adjacent CNTs 100 in one layer are in contact with each other in some embodiments, and in certain embodiments, no CNT's in another layer are in contact with each other. No CNT is in contact with another CNT in the vertical direction in some embodiments.

Figure 5A:
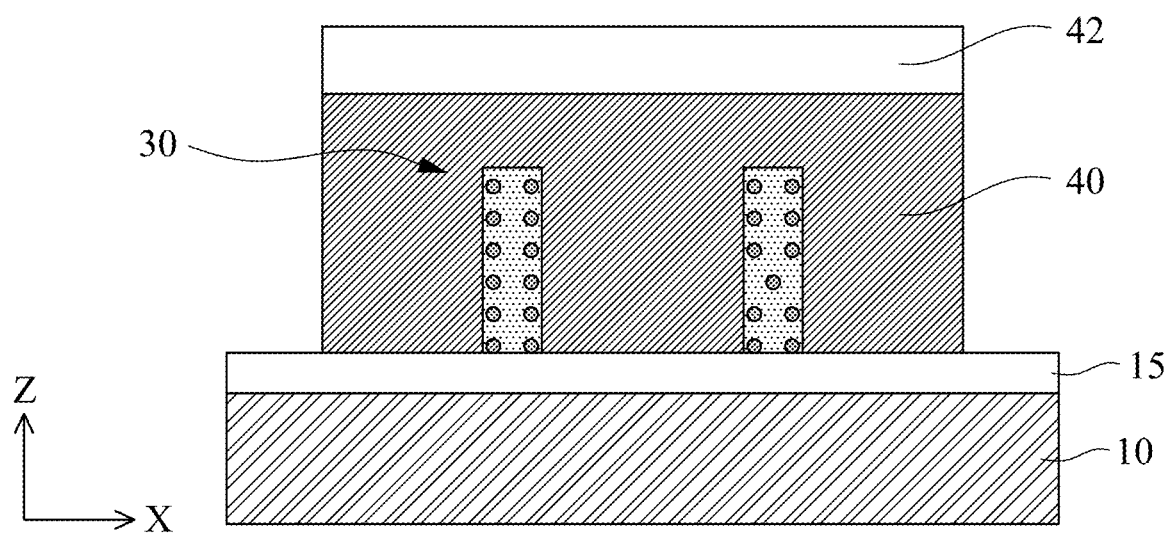
FIGS. 5A and 5B illustrate various stages of a sequential fabrication process of a GAA FET in accordance with an embodiment of the present disclosure.
Figure 5B:
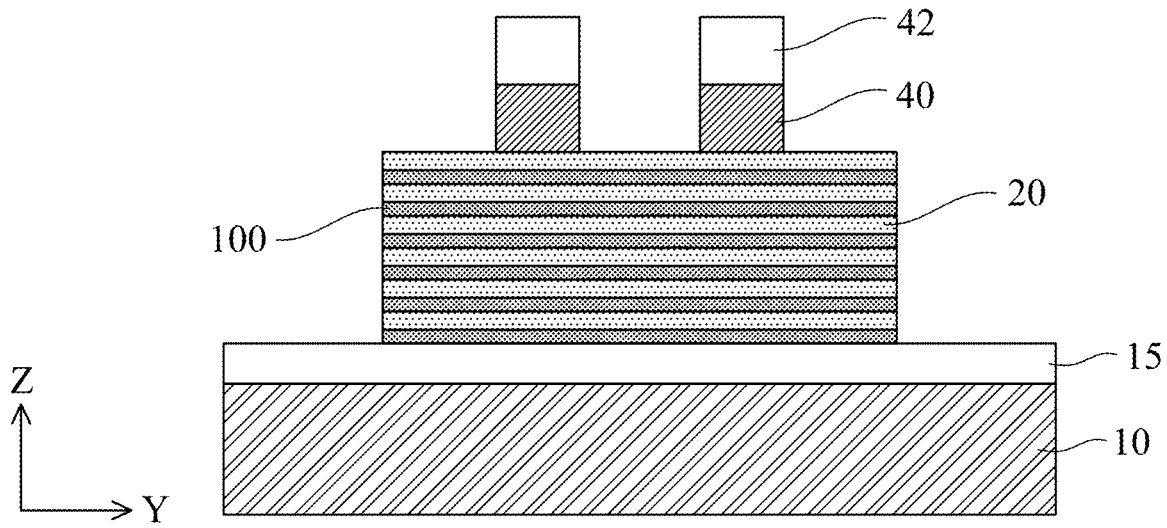

Subsequently, a sacrificial gate structure 40 is formed over the fin structures 30 as shown in FIGS. 5A and 5B. FIG. 5A is a cross sectional view along the X direction and the FIG. 5B is a cross sectional view along the Y direction. The sacrificial gate structure 40 is formed by blanket depositing a sacrificial gate electrode layer over the fin structures 30 such that the fin structures 30 are fully embedded in the sacrificial gate electrode layer. The sacrificial gate electrode layer includes silicon, germanium or silicon germanium, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate electrode layer is deposited using CVD, including LPCVD and PECVD, PVD, ALD, or other suitable process. In some embodiments, no sacrificial gate dielectric layer is formed between the fin structure 30 and the sacrificial gate electrode layer, and in other embodiments, a sacrificial gate dielectric layer is formed between the fin structure 30 and the sacrificial gate electrode layer.

Subsequently, a mask layer 42 is formed over the sacrificial gate electrode layer 40. The mask layer 42 includes one or more of a silicon nitride (SiN) layer and a silicon oxide layer. Next, a patterning operation is performed on the mask layer and sacrificial gate electrode layer is patterned into the sacrificial gate structure 40, as shown in FIGS. 5A and 5B. By patterning the sacrificial gate structure, the fin structures 30 are partially exposed on opposite sides of the sacrificial gate structure 40, thereby defining source/drain (S/D) regions, as shown in FIG. 5B. In this disclosure, a source and a drain are interchangeably used and the structures thereof are substantially the same. In FIGS. 5A and 5B, two sacrificial gate structures 40 are formed over two fin structures 30, but the number of the sacrificial gate structures is not limited to this configuration. One or more than two sacrificial gate structures can be arranged in the Y direction in some embodiments. In certain embodiments, one or more dummy sacrificial gate structures are formed on both sides of the sacrificial gate structures to improve pattern fidelity.

Figure 6A:
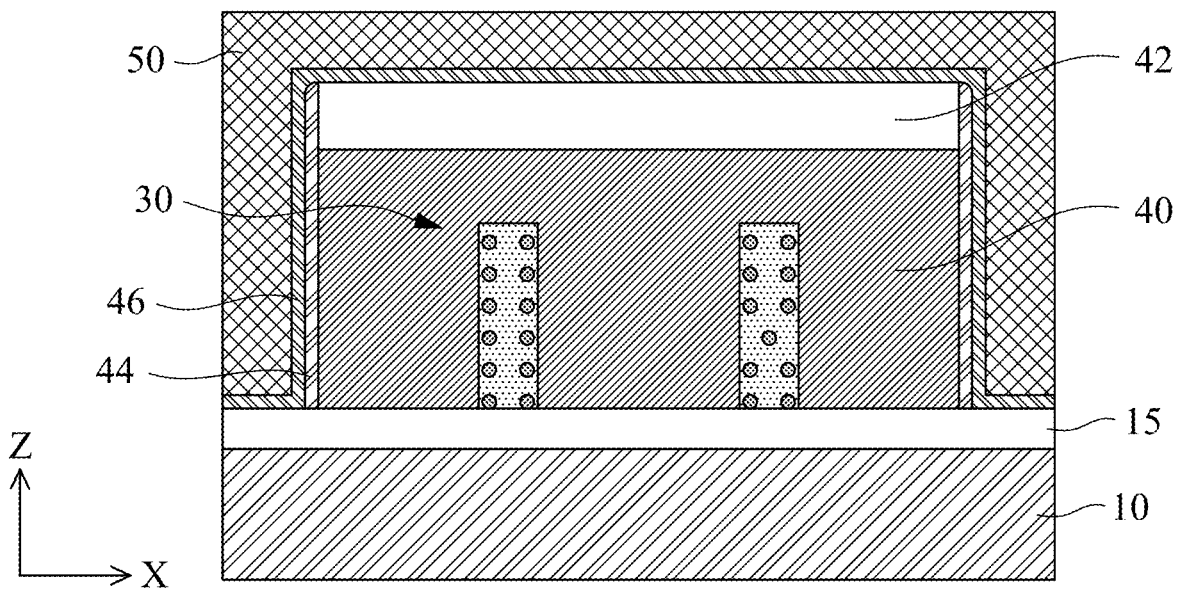
FIGS. 6A and 6B illustrate various stages of a sequential fabrication process of a GAA FET in accordance with an embodiment of the present disclosure.
Figure 6B:
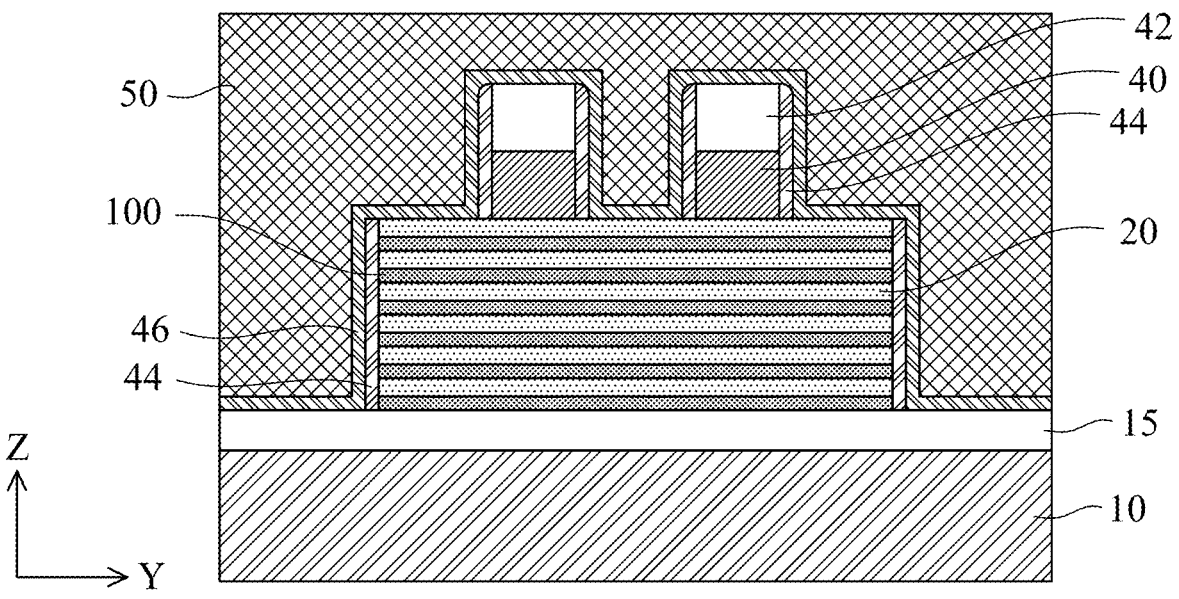

After the sacrificial gate structure 40 is formed, a blanket layer of an insulating material for gate sidewall spacers 44 is conformally formed by using CVD or other suitable methods, as shown in FIGS. 6A and 6B. The blanket layer is deposited in a conformal manner so that it is formed to have substantially equal thicknesses on vertical surfaces, such as the sidewalls, horizontal surfaces, and the top of the sacrificial gate structures 40. In some embodiments, the blanket layer is deposited to a thickness in a range from about 2 nm to about 10 nm. In some embodiments, the insulating material of the blanket layer is a silicon nitride-based material, such as SiN, SiON, SiOCN or SiCN and combinations thereof. In certain embodiments, the insulating material is one of SiOC, SiCON and SiCN. As understood from FIGS. 5B and 6B, in some embodiments, the CNTs 100 are supported by the support layer 20 but are not supported (anchored) by the sidewall spacers 44. In some embodiments, before the blanket layer for the sidewall spacers 44 is formed, the support layer 20 is slightly etched to expose the ends of the CNTs 100. In such a case, the ends of the CNTs 100 are supported (anchored) by the sidewall spacers 44.

Further, as shown in FIGS. 6A and 6B, the gate sidewall spacers 44 are formed on opposite sidewalls of the sacrificial gate structures 40 by anisotropic etching. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces, such as the sidewalls of the sacrificial gate structures and the sidewalls of the exposed fin structures. The mask layer 42 may be exposed from the sidewall spacers. In some embodiments, an isotropic etching process may be subsequently performed to remove the insulating material from the upper portions of the S/D region of the exposed fin structures 30.

Subsequently, a liner layer 46, such as an etch stop layer, is formed to cover the gate structures 40 with the sidewall spacer 44 and the exposed fin structures 30. In some embodiments, the liner layer 46 includes a silicon nitride-based material, such as silicon nitride, SiON, SiOCN or SiCN and combinations thereof, formed by CVD, including LPCVD and PECVD, PVD, ALD, or other suitable process. In certain embodiments, the liner layer 46 is made of silicon nitride. Further, as shown in FIGS. 6A and 6B, a first interlayer dielectric (ILD) layer 50 is formed. The materials for the first ILD layer 50 include compounds comprising Si, O, C and/or H, such as silicon oxide, SiCOH and SiOC. Organic materials, such as polymers, may be used for the first ILD layer 50.

Figure 7A:
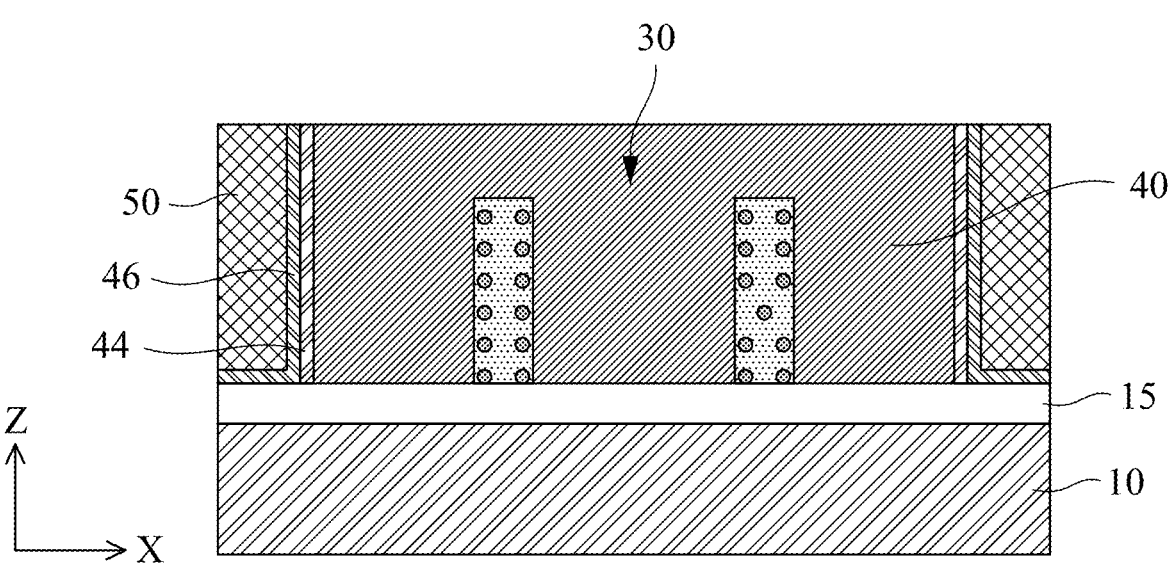
FIGS. 7A and 7B illustrate various stages of a sequential fabrication process of a GAA FET in accordance with an embodiment of the present disclosure.
Figure 7B:
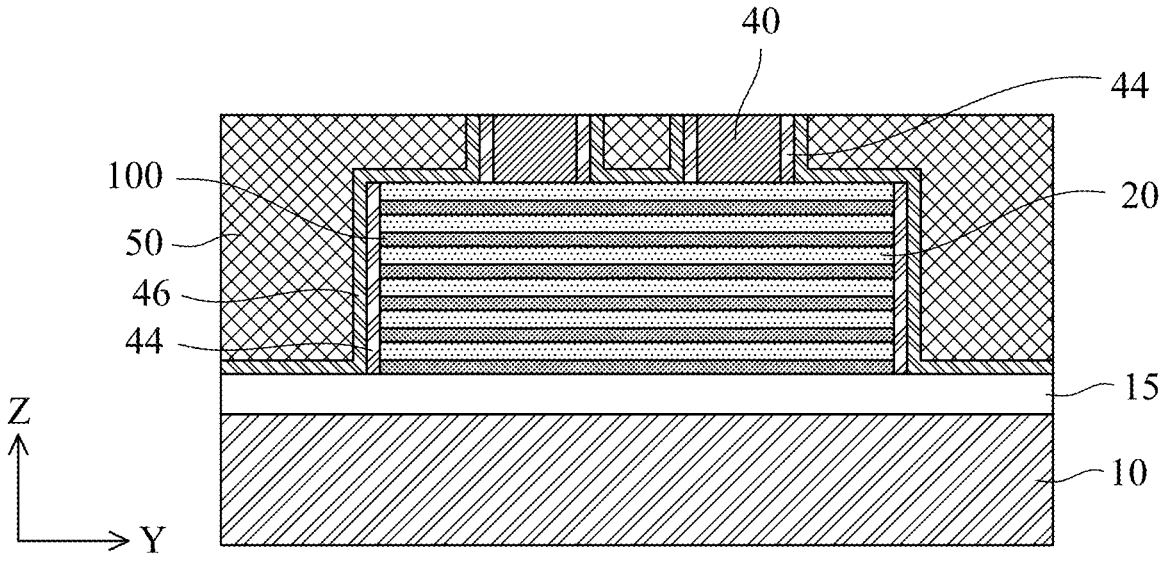
Figure 8A:
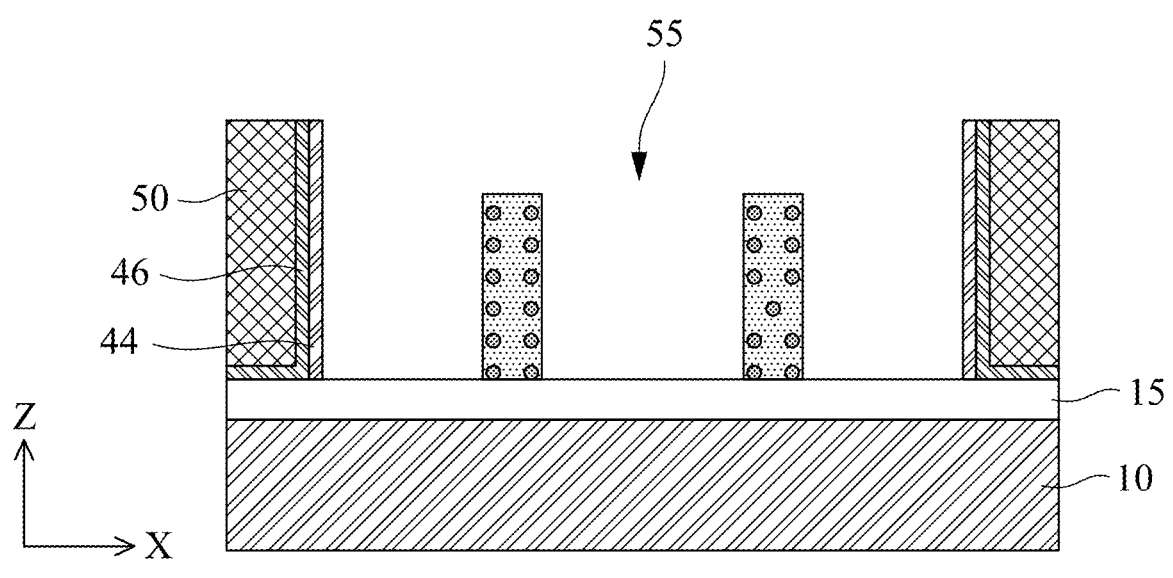
FIGS. 8A and 8B illustrate various stages of a sequential fabrication process of a GAA FET in accordance with an embodiment of the present disclosure.
Figure 8B:
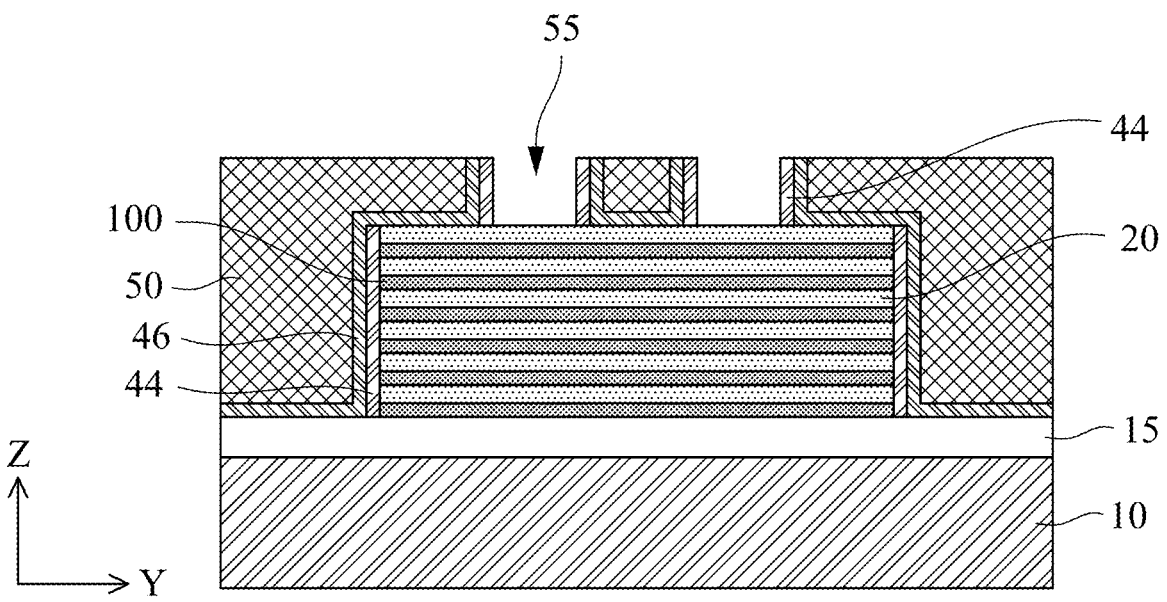

After the first ILD layer 50 is formed, a planarization operation, such as CMP, is performed, so that the sacrificial gate electrode layer 40 is exposed, as shown in FIGS. 7A and 7B. Then, as shown in FIGS. 8A and 8B, the sacrificial gate electrode layer 40 is removed, thereby exposing a channel region of the fin structures in a gate space 55. The sacrificial gate structure 40 can be removed using plasma dry etching and/or wet etching. When the sacrificial gate electrode layer 40 is polysilicon and the first ILD layer 50 is silicon oxide, a wet etchant such as a TMAH solution can be used to selectively remove the sacrificial gate electrode layer 40.

Figure 9A:
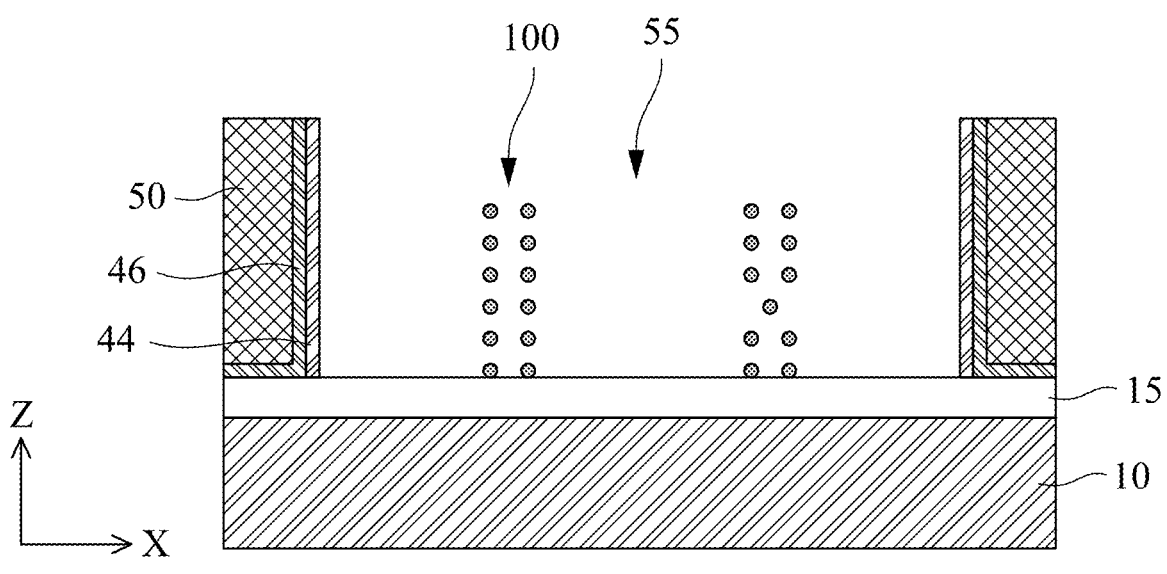
FIGS. 9A, 9B and 9C illustrate various stages of a sequential fabrication process of a GAA FET in accordance with an embodiment of the present disclosure.
Figure 9B:
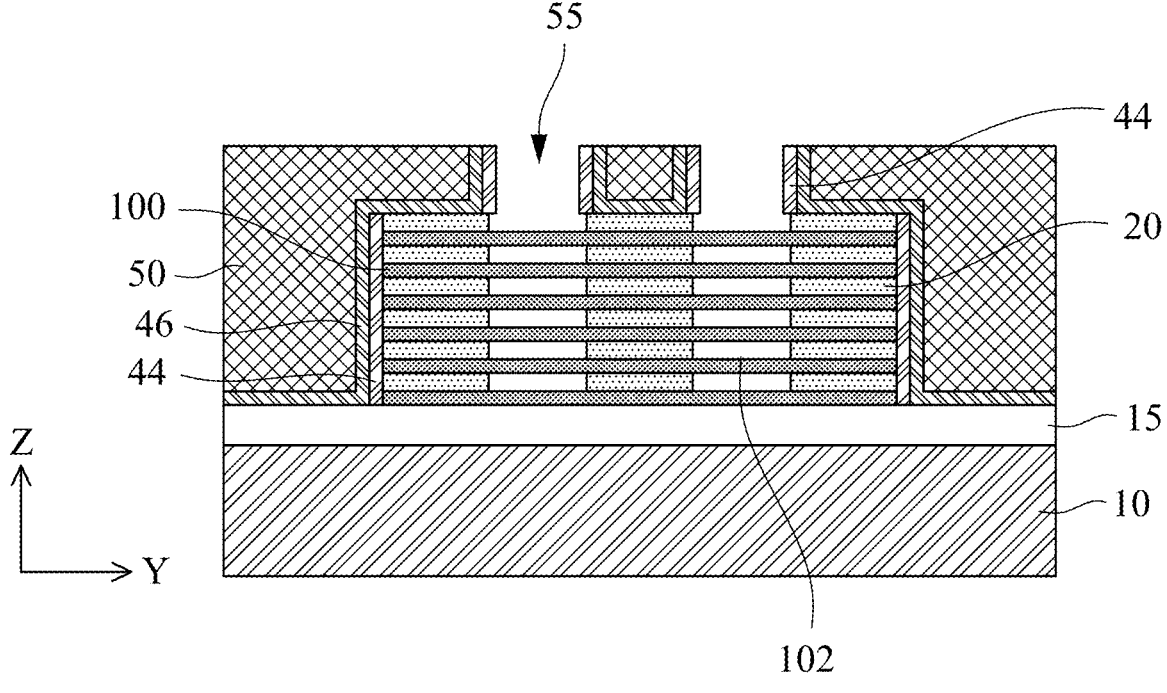
Figure 9C:
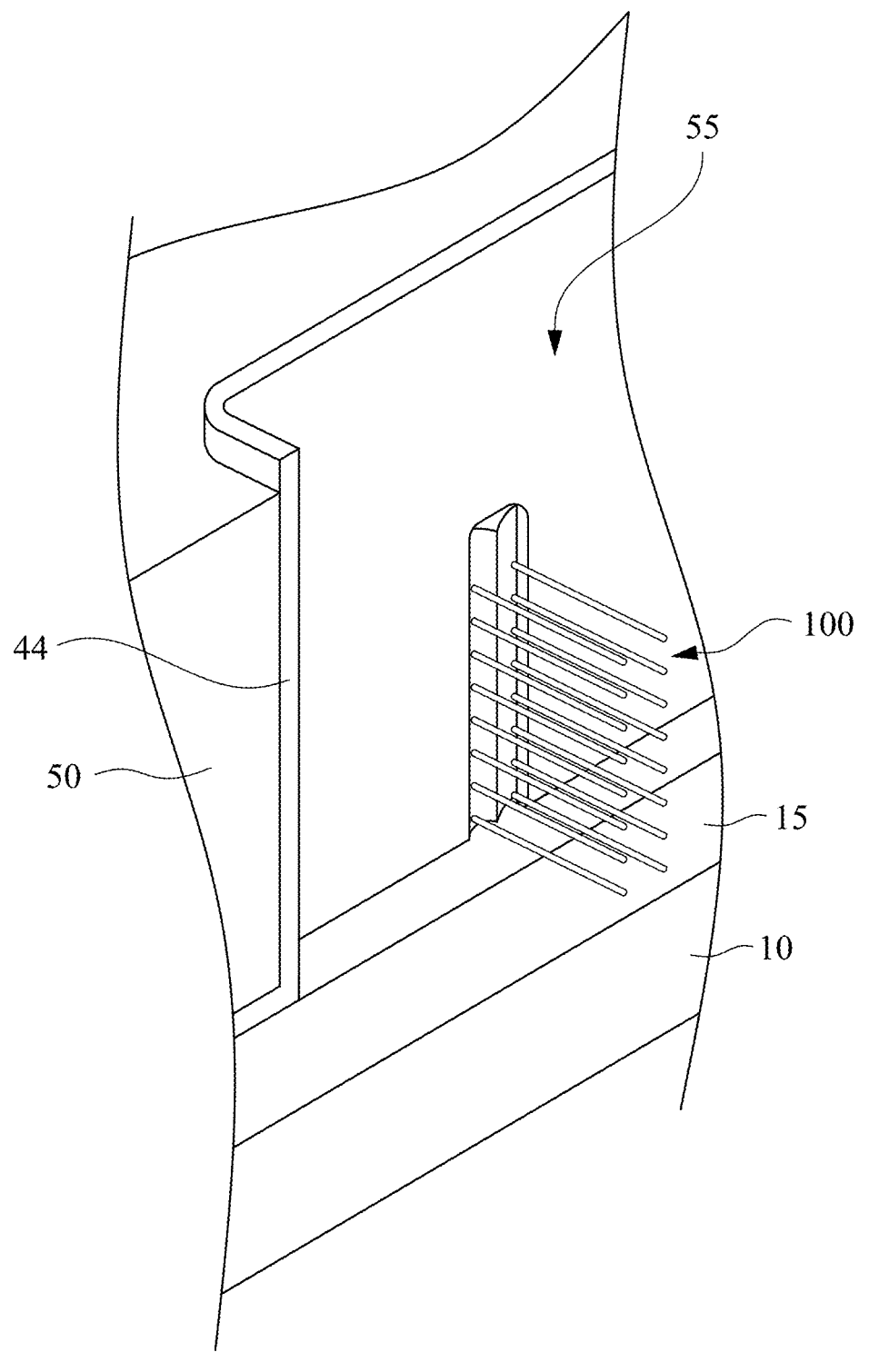

Further, as shown in FIGS. 9A-9C, the support layer 20 in the gate space 55 is removed to release the CNTs 100. FIG. 9C is an isometric view. The support layer 20 can be removed selectively to the CNTs 100 using plasma dry etching and/or wet etching. When the support layer 20 is polysilicon or amorphous silicon and the first ILD layer 50 is silicon oxide, a wet etchant such as a TMAH solution is used. When the sacrificial gate electrode layer 40 and the support layer 20 are made of the same material, the removal of the sacrificial gate electrode layer 40 and the removal of the support layer 20 are performed by the same etching operation.

Figure 10C:
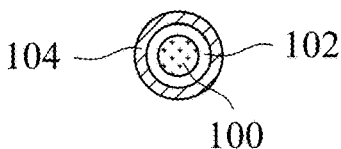
FIGS. 10A, 10B and 10C illustrate various stages of a sequential fabrication process of a GAA FET in accordance with an embodiment of the present disclosure.
Figure 10A:
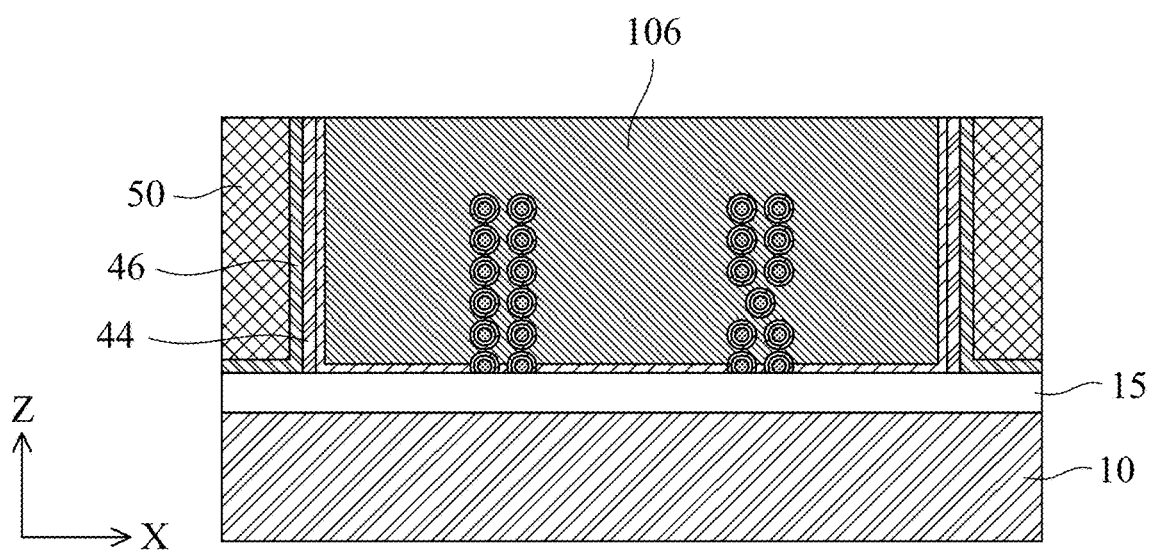
Figure 10B:
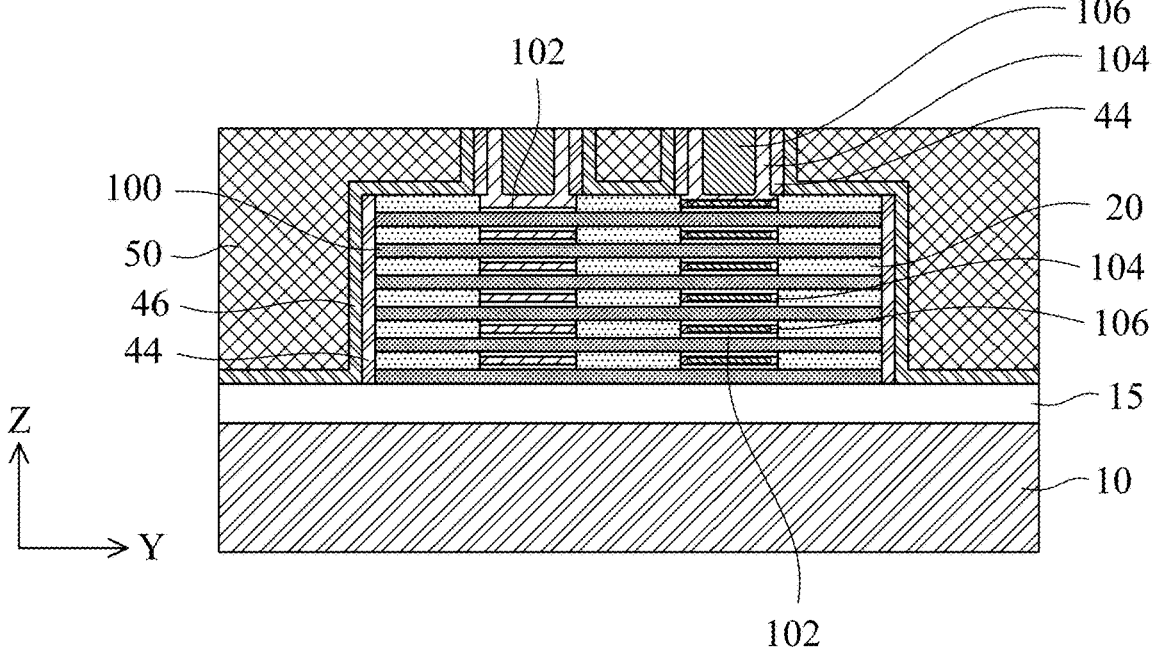

After the channel regions of the CNTs 100 are released, a gate dielectric layer 102 is formed around the CNTs 100, as shown in FIGS. 10A-10C. FIG. 10C is an enlarged view of the gate structure. In some embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 is made of $HfO_2$ for an n-channel FET, and is made of $Al_2O_3$ for a p-channel FET. The gate dielectric layer 102 has a thickness in a range from about 0.5 nm to about 2.5 nm in some embodiments, and has a thickness in a range from about 1.0 nm to about 2.0 nm in other embodiments. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel region of the CNTs 100.

In some embodiments, an interfacial layer (not shown) is formed around the CNTs before the gate dielectric layer 102 is formed. The interfacial layer is made of, for example, $SiO_2$ and has a thickness in a range from about 0.5 nm to about 1.5 nm in some embodiments. In other embodiments, the thickness of the interfacial layer is in a range from about 0.6 nm to about 1.0 nm.

In certain embodiments, one or more work function adjustment layers 104 are formed on the gate dielectric layer 102. The work function adjustment layers 104 are made of a conductive material such as a single layer of TiN, TaN, TaAlC, TiC, TaC, Co, Al, TiAl, HfTi, TiSi, TaSi or TiAlC, or a multilayer of two or more of these materials. In certain embodiments, TiN is used as the work function adjustment layer 104. The work function adjustment layer 104 may be formed by ALD, PVD, CVD, e-beam evaporation, or other suitable process. Further, the work function adjustment layer 104 may be formed separately for the n-channel FET and the p-channel FET which may use different metal layers.

Then, as shown in FIGS. 10A and 10B, a gate electrode layer 106 is formed over the work function adjustment layer 104. The gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 104 has a thickness in a range from about 0.5 nm to about 5.0 nm in some embodiments, and has a thickness in a range from about 0.8 nm to about 1.5 nm in other embodiments. The gate electrode layer 106 may be formed by CVD, ALD, electro-plating, or other suitable method. The gate electrode layer 106 is also deposited over the upper surface of the first ILD layer 50, and the gate dielectric layer 102, the work function adjustment layer 104 and the gate electrode layer 106 formed over the first ILD layer 50 are then planarized by using, for example, CMP, until the first ILD layer 50 is revealed.

In FIGS. 10A and 10B, the gate dielectric layer fully wraps around each of the CNTs 100 and the work function adjustment layer 104 also fully wraps around each of the CNTs 100. In some embodiments, spaces are formed between the work function adjustment layer 104 of adjacent CNTs 100 and the spaces are filled by the gate electrode layer 106.

Figure 11A:
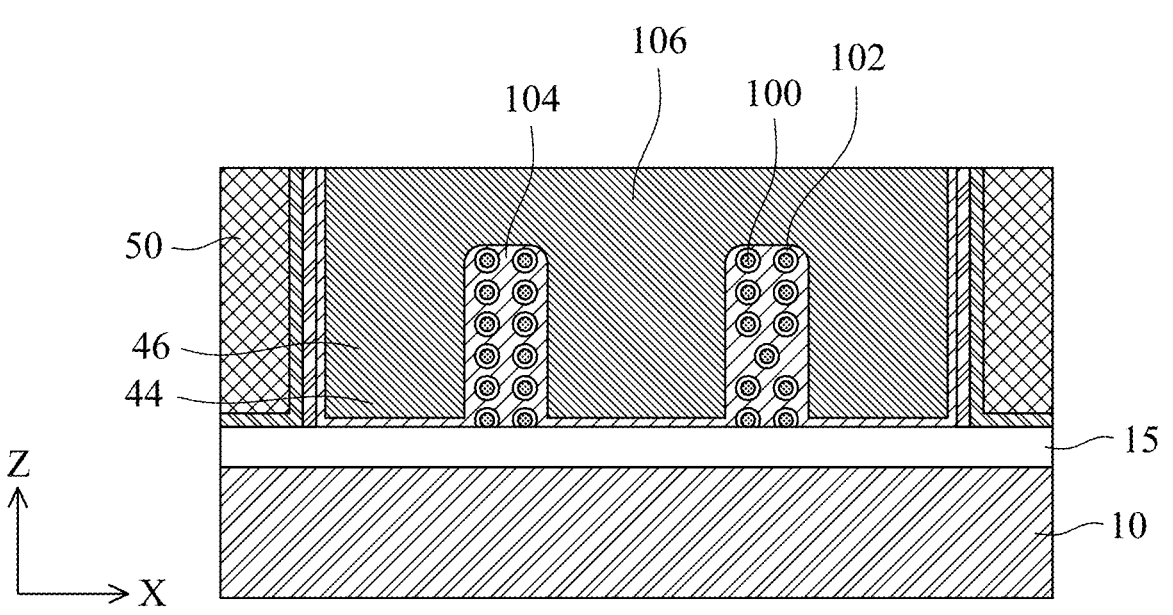
FIGS. 11A and 11B illustrate various stages of a sequential fabrication process of a GAA FET in accordance with an embodiment of the present disclosure.
Figure 11B:
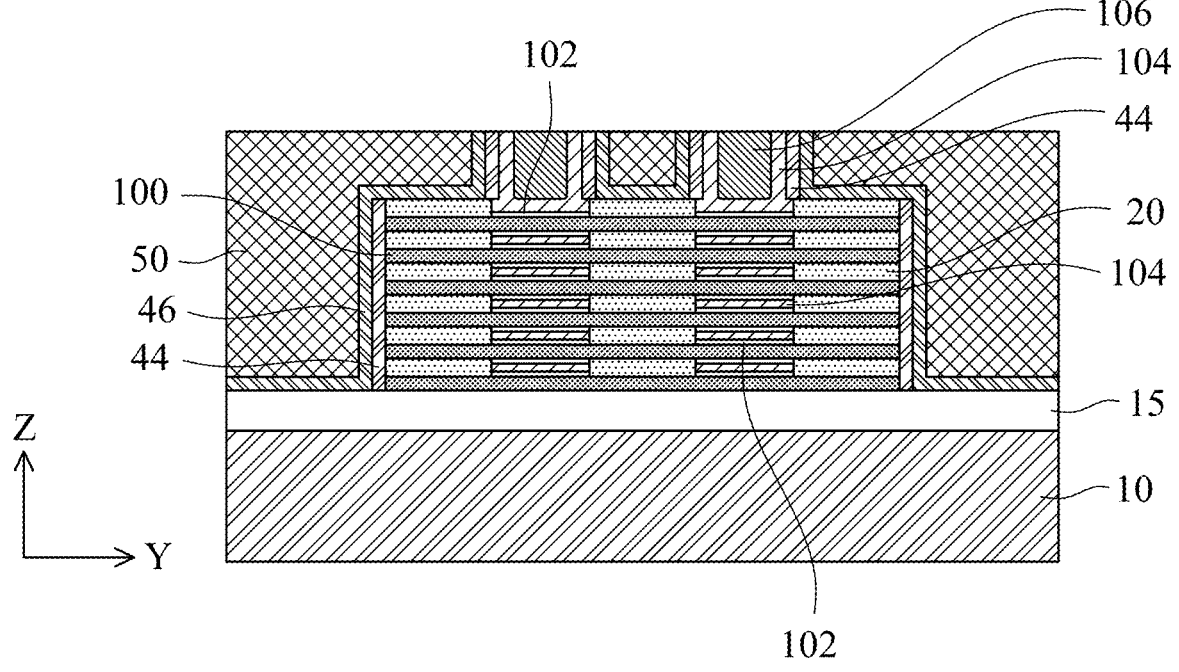

In other embodiments, as shown in FIGS. 11A and 11B, the work function adjustment layer 104 fills spaces between the gate dielectric layer 102 of adjacent CNTs 100, and the gate electrode layer 106 covers outer surface of the work function adjustment layer 104.

Figure 12A:
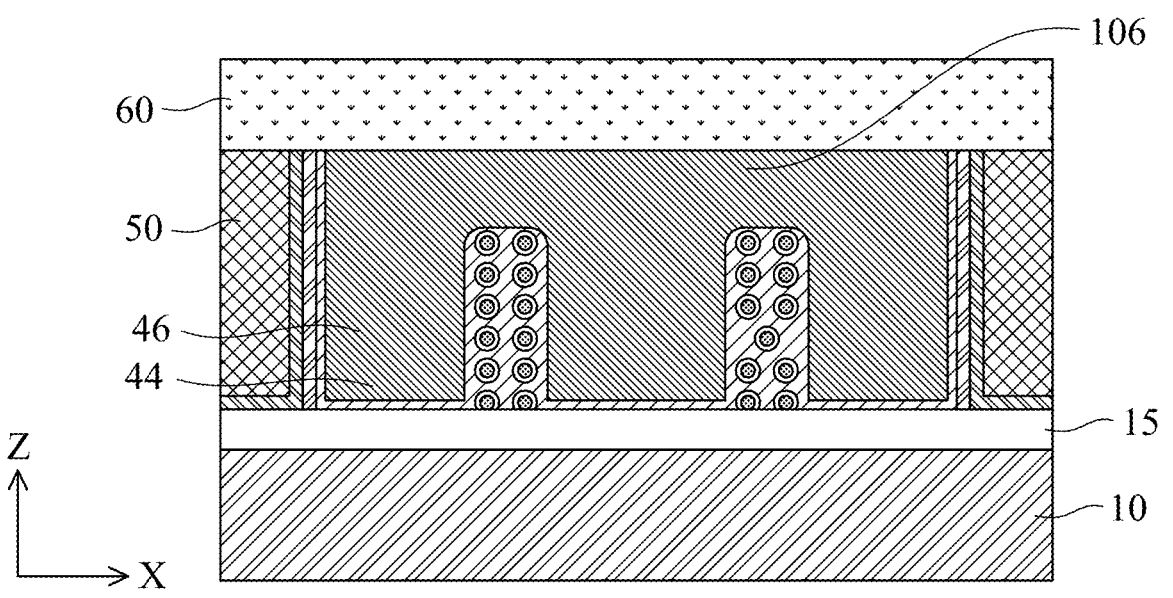
FIGS. 12A, 12B and 12C illustrate various stages of a sequential fabrication process of a GAA FET in accordance with an embodiment of the present disclosure.
Figure 12B:
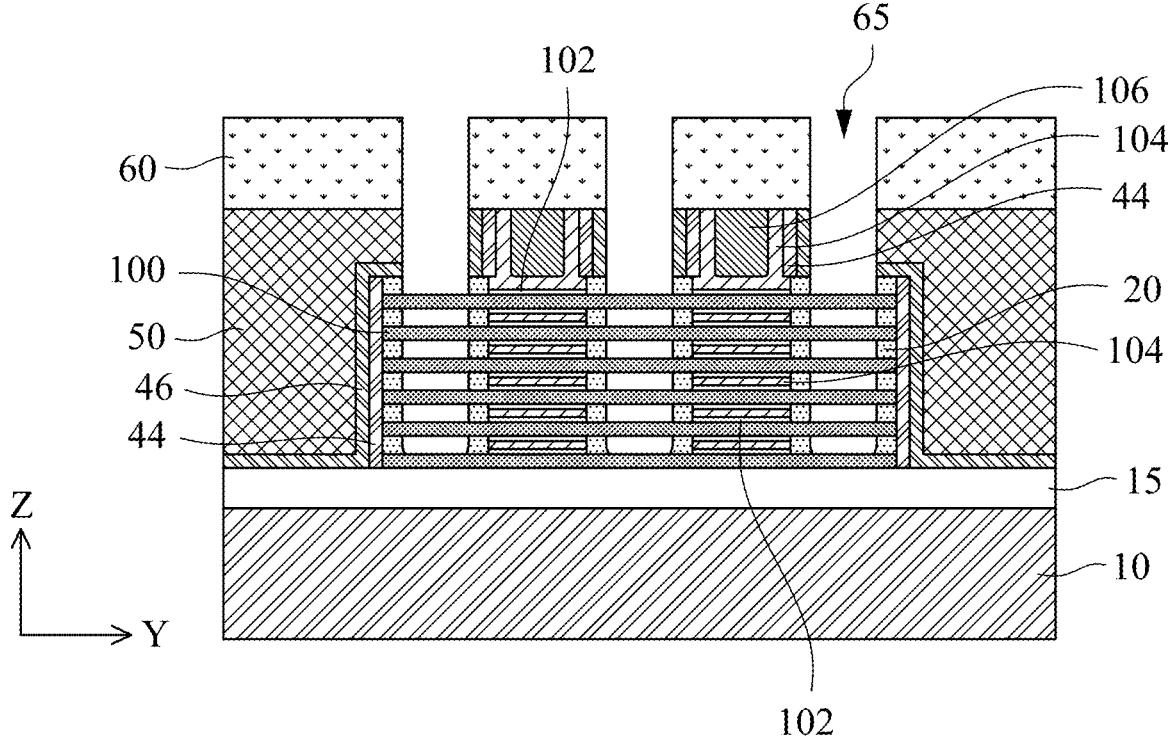
Figure 12C:
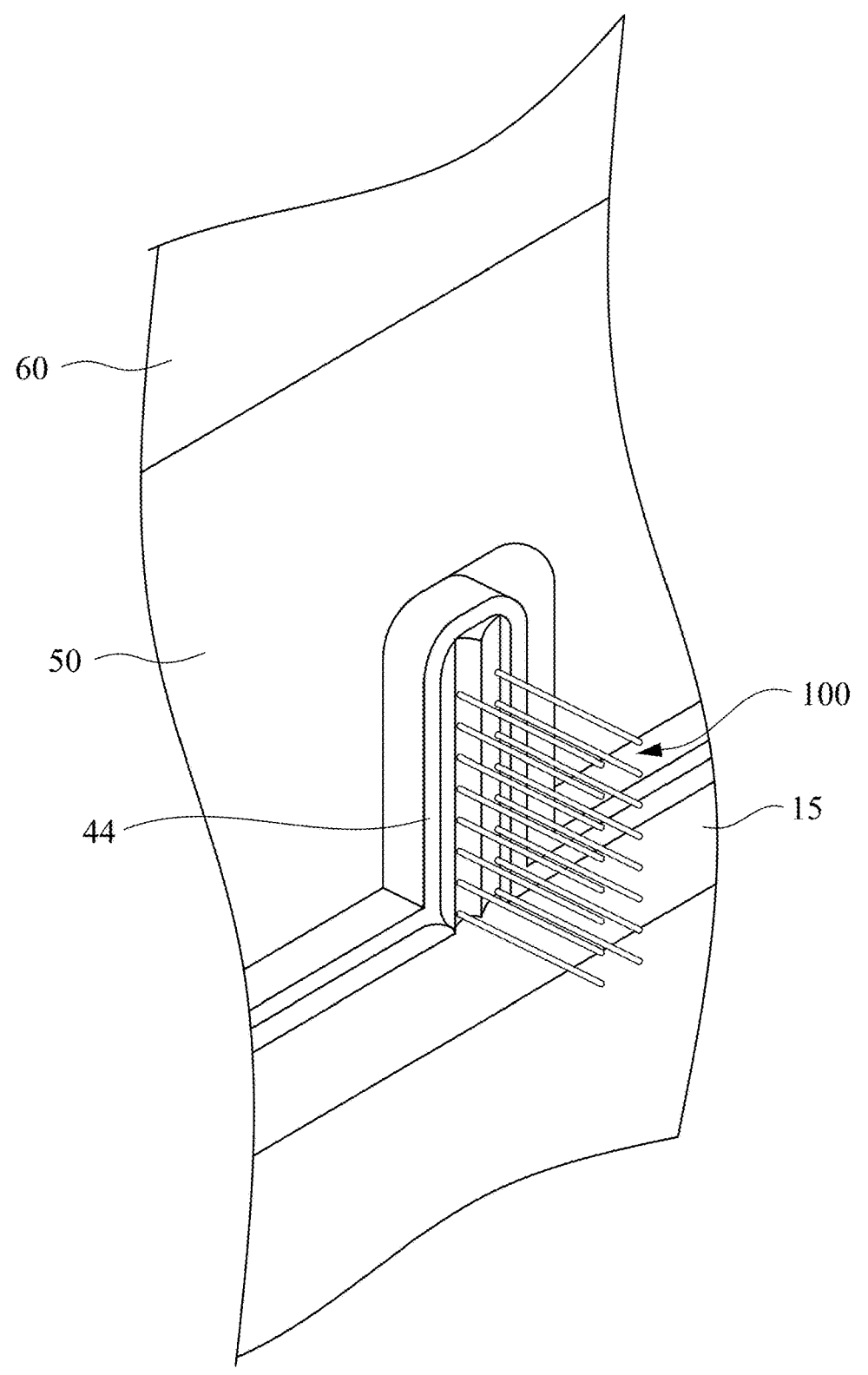

Then, as shown in FIGS. 12A-12C, a second ILD layer 60 is formed over the first ILD layer 50, and source/drain contact openings 65 are formed by using one or more lithography and etching operations. FIG. 12C is an isometric view. By this operation, source/drain regions of the CNTs 100 are exposed in the source/drain contact openings 65. In some embodiments, as shown in FIG. 12B, a part of the support layer 20 remains under the sidewall spacers 44. When the support layer 20 is made of a dielectric material, the remaining support layer 20 functions as inner spacers separating the gate electrode layer 106 and subsequently formed source/drain contact 70/72.

Figure 13A:
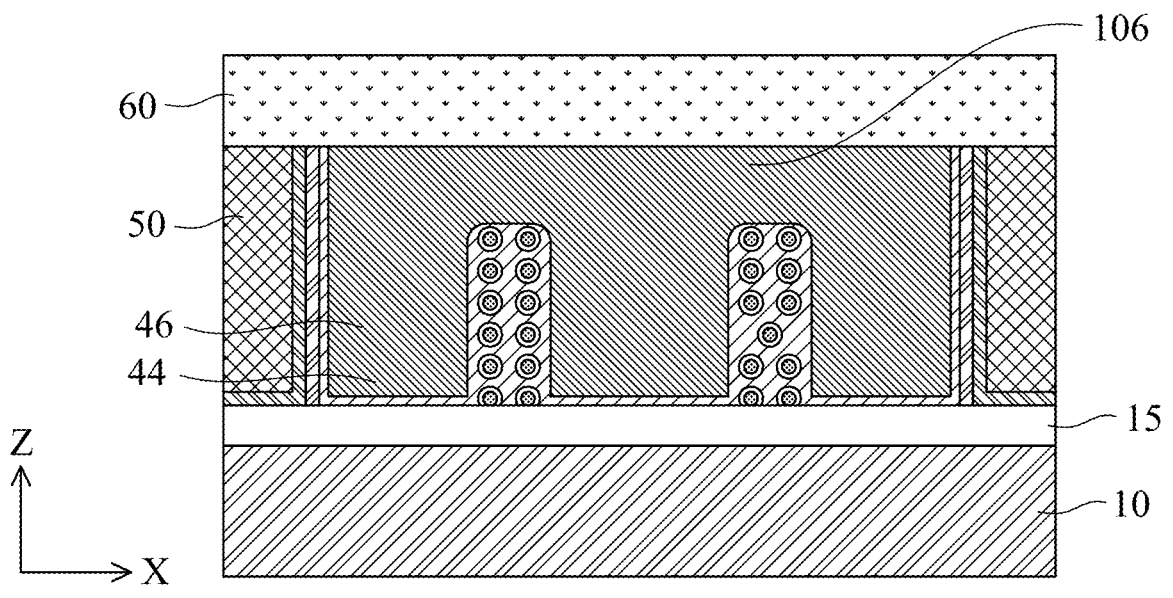
FIGS. 13A and 13B illustrate various stages of a sequential fabrication process of a GAA FET in accordance with an embodiment of the present disclosure.
Figure 13B:
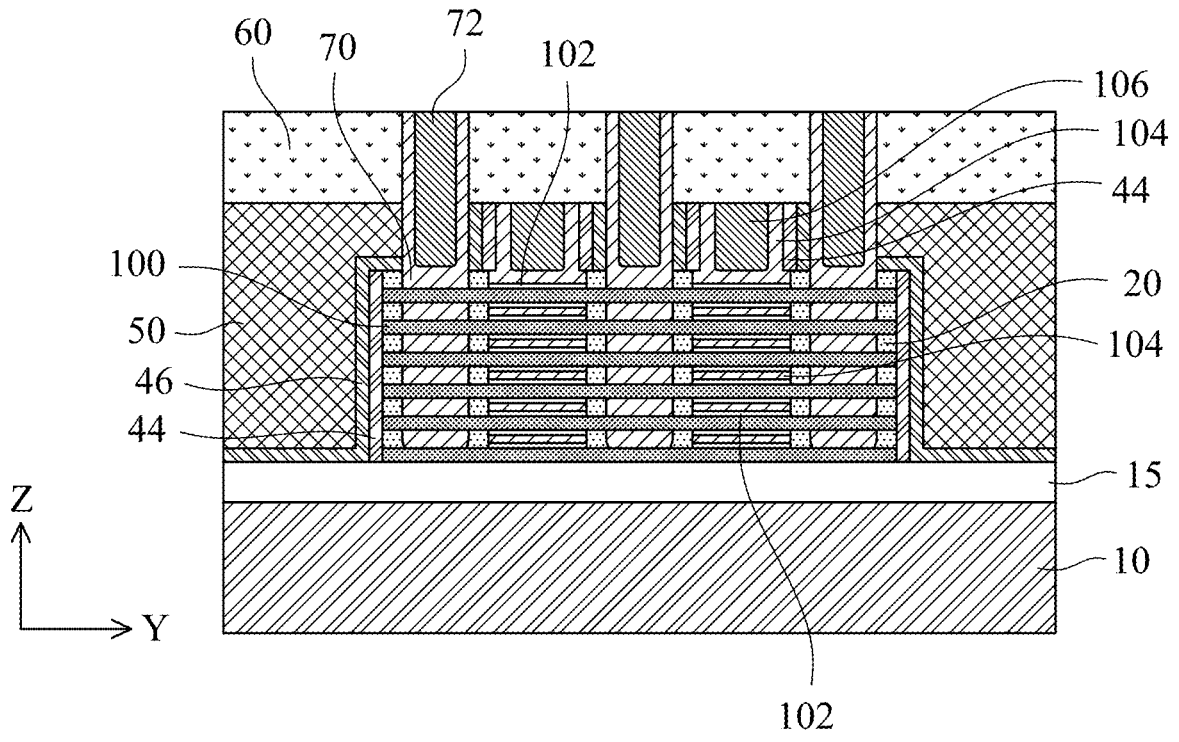

Next, as shown in FIGS. 13A and 13B, the source/drain contact openings 65 are filled with one or more layers of a conductive material. The conductive material includes one or more of W, Cu, Ti, Ag, Al, TiAl, TiAlN, TaC, TaCN, TaSiN, Mn, Co, Pd, Ni, Re, Ir, Ru, Pt, and Zr, or any other suitable conductive materials. In some embodiments, a lower contact layer 70 wraps around the source/drain regions of CNTs 100 and an upper contact layer 72 is formed on the lower contact layer 70. In some embodiments, the lower contact layer 70 is one or more of TiN, Ti and TaN. The upper contact layer is one or more of W, Cu and Co in some embodiments. Further, in some embodiments, one or more gate contacts are formed at the same time as the source/drain contacts or by different operations from the source/drain contacts.

The total number of the CNTs 100 in one GAA FET is in a range from about 5 to about 100 in some embodiments, and is in a range from about 10 about 50 in other embodiments. The total number of CNTs in one GAA FET is different from a total number of CNTs in another GAA FET, in some embodiments. In some embodiments, in a GAA FET, two CNTs among the CNTs contact each other in a horizontal direction, and no CNT contacts another CNT in a vertical direction.

In some embodiments, the source/drain contacts are first formed and then the gate structure is formed.

FIGS. 14A-14D illustrate various stages of fabrication operations of a GAA FET using carbon nanotubes in accordance with other embodiments of the present disclosure. It is understood that additional operations can be provided before, during, and after processes shown by FIGS. 14A-14D, and some of the operations described below can be replaced or eliminated, for additional embodiments of the method. The order of the operations/processes may be interchangeable. Materials, configurations, dimensions, processes and/or operations same as or similar to those described with respect to FIGS. 1A-13B may be employed in the following embodiments and the detailed explanation may be omitted.

Figure 14A:
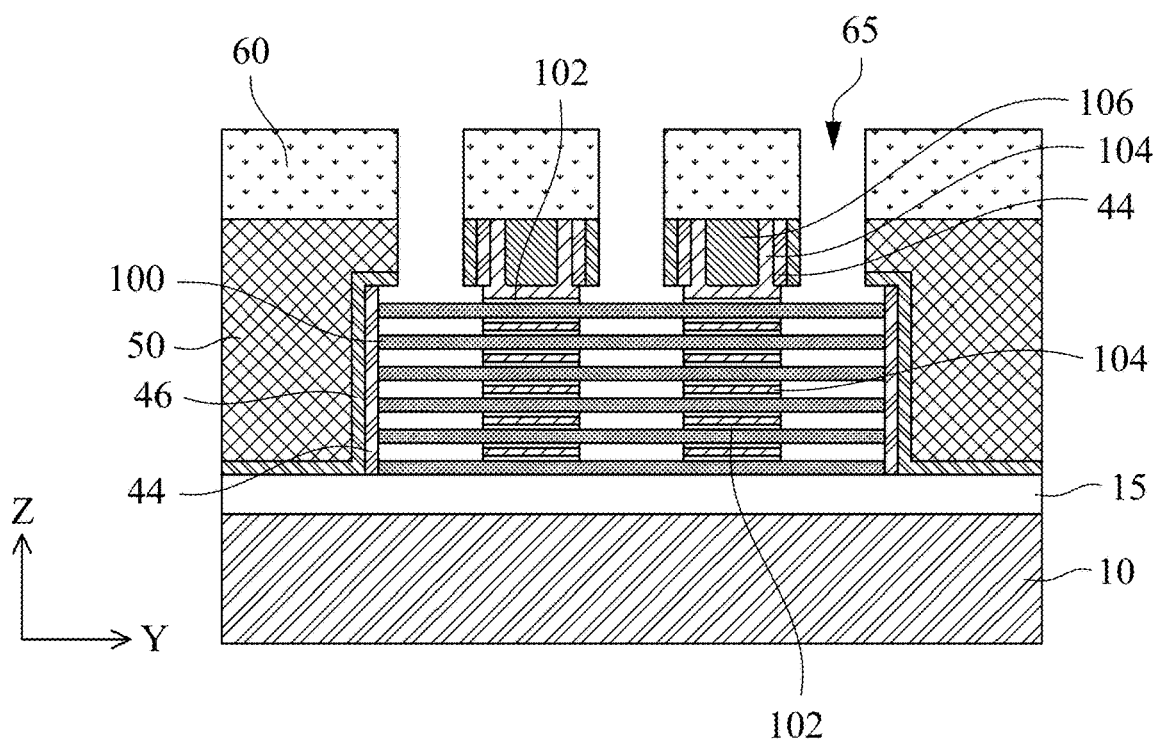
FIGS. 14A, 14B and 14C illustrate various stages of a sequential fabrication process of a GAA FET in accordance with an embodiment of the present disclosure.
Figure 14B:
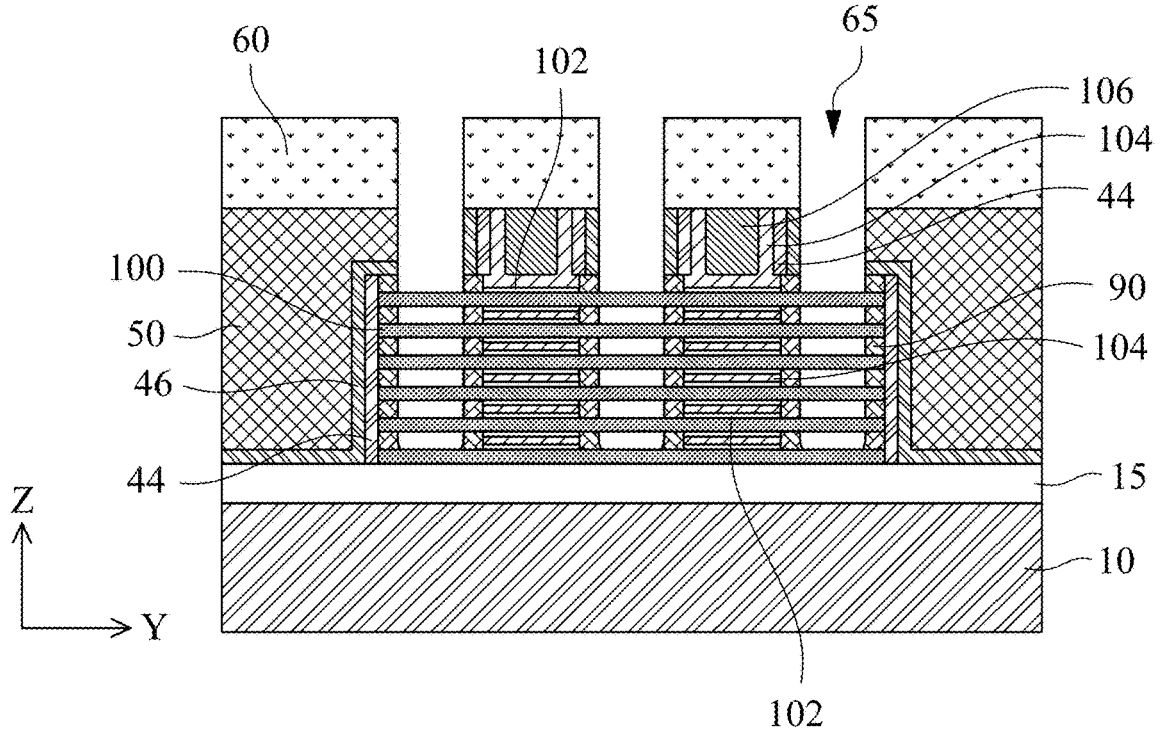
Figure 14C:
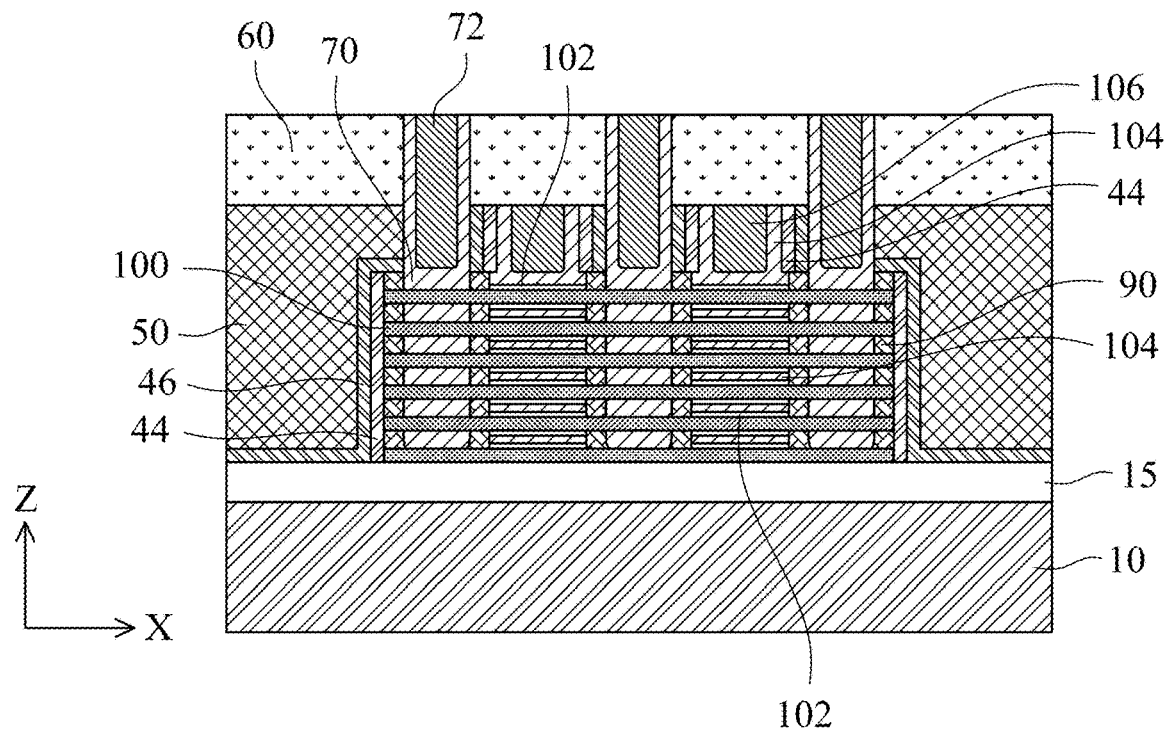

When the source/drain contact openings 55 are formed, the support layer 20 is further etched so that the support layer 20 is fully removed, as shown in FIG. 14A. Then, one or more layers of dielectric materials are formed in the source/drain contact opening 55 and by anisotropic etching, inner spacers 90 are formed, as shown in FIG. 14B. Then, similar to FIGS. 13A and 13B, the source/drain contacts 70/72 are formed as shown in FIG. 14C. The dielectric material for the inner spacers 90 includes one or more of SiN, SiON, SiOCN, SiOC and SiCN and combinations thereof.

Figure 14D:
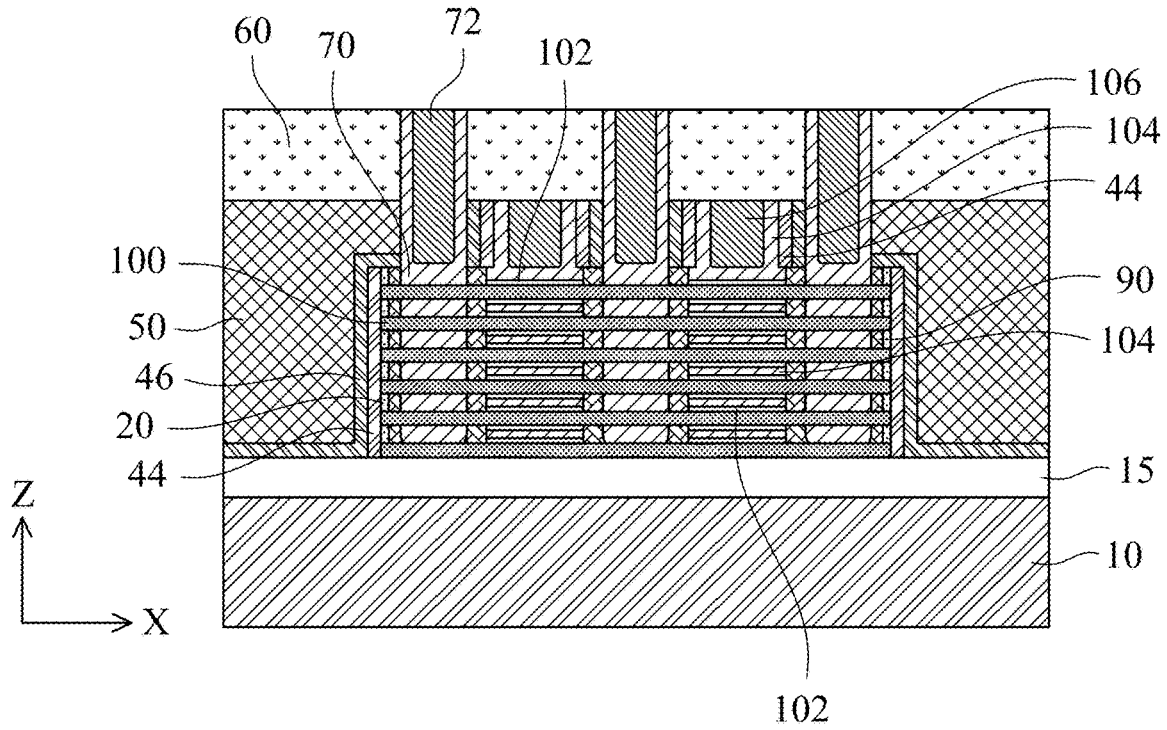
FIG. 14D illustrates various stages of a sequential fabrication process of a GAA FET in accordance with an embodiment of the present disclosure.

In other embodiments, when the source/drain contact openings 55 are formed, the support layer 20 is further etched but a thin layer of the support layer 20 remains as shown in FIG. 14D. In some embodiments, the thin layer of support structure 20 remains at end portions of the CNTs 100 opposite to the gate structure. The inner spacers 90 are formed on the thin layer of the support structure.

Subsequently, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages. For example, in the present disclosure, stacked structures of CNTs are formed as fin structures, it is possible to increase CNT density within one GAA FET.

In accordance with an aspect of the present disclosure, in a method of forming a gate-all-around field effect transistor (GAA FET), a bottom support layer is formed over a substrate a first group of carbon nanotubes (CNTs) are disposed over the bottom support layer. A first support layer is formed over the first group of CNTs and the bottom support layer such that the first group of CNTs are embedded in the first support layer. A second group of carbon nanotubes (CNTs) are disposed over the first support layer. A second support layer is formed over the second group of CNTs and the first support layer such that the second group of CNTs are embedded in the second support layer. A fin structure is formed by patterning at least the first support layer and the second support layer. In one or more of the foregoing and following embodiments, forming a group of CNTs and forming a support layer are repeated to form n support layers in which CNT's are embedded, where n is integer of three or more. In one or more of the foregoing and following embodiments, the bottom support layer includes an insulating material. In one or more of the foregoing and following embodiments, the substrate is a semiconductor material. In one or more of the foregoing and following embodiments, the first support layer and the second support layer are made of a same material. In one or more of the foregoing and following embodiments, the first support layer and the second support layer includes a polycrystalline or amorphous material of one of Si, Ge and SiGe. In one or more of the foregoing and following embodiments, the first support layer and the second support layer includes a dielectric material. In one or more of the foregoing and following embodiments, the bottom support layer is made of a different material than the first support layer and the second support layer. In one or more of the foregoing and following embodiments, a planarization operation is performed after at least one of the first support layer and the second support layer is formed.

In accordance with another aspect of the present application, in a method of forming a gate-all-around field effect transistor (GAA FET), a fin structure, in which carbon nanotubes (CNTs) are embedded in a support material, is formed over a substrate. A sacrificial gate structure is formed over the fin structure. A dielectric layer is formed over the sacrificial gate structure and the fin structure. The sacrificial gate structure is removed so that a part of the fin structure is exposed. The support material is removed from the exposed part of the fin structure so that channel regions of CNTs are exposed. A gate structure is formed around the exposed channel regions of CNTs. In one or more of the foregoing and following embodiments, the support material includes a polycrystalline or amorphous material of one of Si, Ge and SiGe. In one or more of the foregoing and following embodiments, the support material includes a dielectric material different from the dielectric layer. In one or more of the foregoing and following embodiments, an opening is formed in the dielectric layer and the support material so that source/drain regions of the CNTs are exposed, and one or more conductive layers are formed in the opening around the exposed source/drain regions of the CNTs. In one or more of the foregoing and following embodiments, in the fin structure, two CNTs among the CNTs contact each other in a horizontal direction, and no CNT contacts another CNT in a vertical direction. In one or more of the foregoing and following embodiments, the gate structure includes a gate dielectric layer wrapping around each of the CNTs, a work function adjustment layer formed on the gate dielectric layer and a body gate electrode layer formed on the work function adjustment layer. In one or more of the foregoing and following embodiments, the work function adjustment layer partially wraps around the CNTs with the gate dielectric layer. In one or more of the foregoing and following embodiments, the work function adjustment layer fully wraps around each of the CNTs with the gate dielectric layer. In one or more of the foregoing and following embodiments, the gate dielectric layer includes one selected from the group consisting of $HfO_2$ and $Al_2O_3$. In one or more of the foregoing and following embodiments, the work function adjustment layer includes TiN.

In accordance with another aspect of the present disclosure, in a method of forming a gate-all-around field effect transistor (GAA FET), a first fin structure and a second fin structure, in each of which carbon nanotubes (CNTs) are embedded in a support material, are formed over a substrate. A dummy gate structure is formed over the first and second fin structures. A dielectric layer is formed over the dummy gate structure and the first and second fin structures. The dummy gate structure is removed so that a part of the first and second fin structures is exposed. The support material is removed from the exposed part of the first and second fin structures so that channel regions of CNTs are exposed. A gate structure is formed around the exposed channel regions of CNTs. A total number of CNTs in the first fin structure is different from a total number of CNTs in the second fin structure.

In accordance with one aspect of the present disclosure, a semiconductor device having a gate-all-around field effect transistor, includes carbon nanotubes (CNTs) disposed over a substrate, a gate structure formed around the CNTs in a channel region, and a source/drain contact formed around the CNTs in a source/drain region. Two CNTs among the CNTs contact each other in a horizontal direction, and no CNT contacts another CNT in a vertical direction. In one or more of the foregoing and following embodiments, the gate structure includes a gate dielectric layer wrapping around each of the CNTs, a work function adjustment layer formed on the gate dielectric layer and a body gate electrode layer formed on the work function adjustment layer. In one or more of the foregoing and following embodiments, the work function adjustment layer partially wraps around the CNTs with the gate dielectric layer. In one or more of the foregoing and following embodiments, the work function adjustment layer fully wraps around each of the CNTs with the gate dielectric layer. In one or more of the foregoing and following embodiments, the gate dielectric layer includes one selected from the group consisting of $HfO_2$ and $Al_2O_3$. In one or more of the foregoing and following embodiments, wherein the work function adjustment layer includes TiN. In one or more of the foregoing and following embodiments, the semiconductor device further includes inner spacers formed between the gate structure and the source/drain contact.

In accordance with another aspect of the present application, a semiconductor device having a gate-all-around field effect transistor (GAA FET) includes a first GAA FET and a second GAA FET. Each of the first GAA FET and the second GAA FET includes carbon nanotubes (CNTs) disposed over a substrate, a gate structure formed around the CNTs in a channel region, and a source/drain contact formed around the CNTs in a source/drain region. A total number of CNTs in the first GAA FET is different from a total number of CNTs in the second GAA FET. In one or more of the foregoing and following embodiments, the gate structure includes a gate dielectric layer wrapping around each of the CNTs, a work function adjustment layer formed on the gate dielectric layer and a body gate electrode layer formed on the work function adjustment layer. In one or more of the foregoing and following embodiments, the work function adjustment layer partially wraps around the CNTs with the gate dielectric layer. In one or more of the foregoing and following embodiments, the work function adjustment layer fully wraps around each of the CNTs with the gate dielectric layer. In one or more of the foregoing and following embodiments, the gate dielectric layer includes one selected from the group consisting of $HfO_2$ and $Al_2O_3$. In one or more of the foregoing and following embodiments, the work function adjustment layer includes TiN. In one or more of the foregoing and following embodiments, the semiconductor device further includes inner spacers formed between the gate structure and the source/drain contact.

In accordance with another aspect of the present application, a semiconductor device having a gate-all-around field effect transistor includes carbon nanotubes (CNTs) disposed over a substrate, a gate structure formed around the CNTs in a channel region, and a source/drain contact formed around the CNTs in a source/drain region. The CNTs are arranged in multiple layers, and a pitch P between adjacent layers is $0.9 \times P_A \leq P \leq 1.1 \times P_A$, where $P_A$ is an average pitch of the multiple layers. In one or more of the foregoing and following embodiments, the gate structure includes a gate dielectric layer wrapping around each of the CNTs, a work function adjustment layer formed on the gate dielectric layer and a body gate electrode layer formed on the work function adjustment layer. In one or more of the foregoing and following embodiments, the work function adjustment layer partially wraps around the CNTs with the gate dielectric layer. In one or more of the foregoing and following embodiments, the work function adjustment layer fully wraps around each of the CNTs with the gate dielectric layer. In one or more of the foregoing and following embodiments, the gate dielectric layer includes one selected from the group consisting of $HfO_2$ and $Al_2O_3$. In one or more of the foregoing and following embodiments, a total number of CNTs in at least one layer is different from a total number of CNTs in another layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a gate-all-around field effect transistor, comprising:

carbon nanotubes (CNTs) disposed in a first layer and a second layer stacked over a substrate;

a gate structure formed around the CNTs in a channel region; and a source/drain contact formed around the CNTs in a source/drain region, wherein the CNTs have an average diameter $D_{CNT}$ and a pitch $P_H$ along a horizontal direction in the first layer, and the pitch is $D_{CNT} \leq P_H \leq (10 \times D_{CNT})$, and adjacent CNTs in at least one of the first layer and the second layer are in contact with each other.

2. The semiconductor device of claim 1, wherein the gate structure includes a gate dielectric layer wrapping around each of the CNTs, a work function adjustment layer formed on the gate dielectric layer and a body gate electrode layer formed on the work function adjustment layer.

3. The semiconductor device of claim 2, wherein:

the work function adjustment layer partially wraps around the CNTs with the gate dielectric layer, and the pitch $P_H$ varies within one of the first layer and the second layer.

4. The semiconductor device of claim 2, wherein the work function adjustment layer fully wraps around each of the CNTs with the gate dielectric layer.

5. The semiconductor device of claim 2, wherein the gate dielectric layer includes one selected from the group consisting of $HfO_2$ and $Al_2O_3$.

6. The semiconductor device of claim 2, wherein the work function adjustment layer includes TiN.

7. The semiconductor device of claim 1, further comprising inner spacers formed between the gate structure and the source/drain contact.

8. A semiconductor device having a gate-all-around field effect transistor (GAA FET), comprising:

a first GAA FET; and a second GAA FET, wherein:

each of the first GAA FET and the second GAA FET includes:

a plurality of layers arranged along a first direction, each layer including a plurality of carbon nanotubes (CNTs) arranged along a second direction perpendicular to the first direction disposed over a substrate;

a gate structure, including a gate electrode, formed around the CNTs in a channel region; and a source/drain contact formed around the CNTs in a source/drain region, wherein the first GAA FET and the second GAA FET share the gate electrode, the CNTs have an average diameter $D_{CNT}$ and a pitch $P_H$ along the second direction, and the pitch is $D_{CNT} \leq P_H \leq (10 \times D_{CNT})$, and adjacent CNTs in at least one of the plurality of layers are in contact with each other.

9. The semiconductor device of claim 8, wherein the gate structure includes a gate dielectric layer wrapping around each of the CNTs, a work function adjustment layer formed on the gate dielectric layer and a body gate electrode layer formed on the work function adjustment layer.

10. The semiconductor device of claim 9, wherein:

the work function adjustment layer partially wraps around the CNTs with the gate dielectric layer, and the pitch $P_H$ varies within one of the plurality of layers.

11. The semiconductor device of claim 9, wherein the work function adjustment layer fully wraps around each of the CNTs with the gate dielectric layer.

12. The semiconductor device of claim 9, wherein the gate dielectric layer includes one selected from the group consisting of $HfO_2$ and $Al_2O_3$.

13. The semiconductor device of claim 9, wherein the work function adjustment layer includes TiN.

14. The semiconductor device of claim 8, further comprising inner spacers formed between the gate structure and the source/drain contact.

15. A semiconductor device having a gate-all-around field effect transistor, comprising:

carbon nanotubes (CNTs) disposed over a substrate;

a gate structure formed around the CNTs in a channel region; and a source/drain contact formed around the CNTs in a source/drain region, wherein:

the CNTs are arranged in multiple layers, adjacent CNTs in at least one of the multiple layers are in contact with each other, and a vertical pitch P between adjacent layers is $0.9 \times P_A \leq P \leq 1.1 \times P_A$, where $P_A$ is an average pitch of the multiple layers.

16. The semiconductor device of claim 15, wherein the gate structure includes a gate dielectric layer wrapping around each of the CNTs, a work function adjustment layer formed on the gate dielectric layer and a body gate electrode layer formed on the work function adjustment layer.

17. The semiconductor device of claim 16, wherein:

the work function adjustment layer partially wraps around the CNTs with the gate dielectric layer, and a horizontal pitch $P_H$ varies within one of the multiple layers.

18. The semiconductor device of claim 16, wherein the work function adjustment layer fully wraps around each of the CNTs with the gate dielectric layer.

19. The semiconductor device of claim 16, wherein the gate dielectric layer includes one selected from the group consisting of $HfO_2$ and $Al_2O_3$.

20. The semiconductor device of claim 16, wherein the work function adjustment layer includes TiN.

* * * * *